(12) United States Patent
Imaizumi

(10) Patent No.: US 11,016,524 B2
(45) Date of Patent: May 25, 2021

(54) ANALOG SWITCH

(71) Applicant: ABLIC Inc., Tokyo (JP)

(72) Inventor: Eiki Imaizumi, Tokyo (JP)

(73) Assignee: ABLIC INC., Tokyo (JP)

( * ) Notice: Subject to any disclaimer, the term of this patent is extended or adjusted under 35 U.S.C. 154(b) by 0 days.

(21) Appl. No.: 17/061,874

(22) Filed: Oct. 2, 2020

(65) Prior Publication Data

US 2021/0116957 A1    Apr. 22, 2021

(30) Foreign Application Priority Data

Oct. 18, 2019 (JP) .............................. JP2019-191404

(51) Int. Cl.
*G06F 1/08* (2006.01)
*H03K 17/687* (2006.01)

(52) U.S. Cl.
CPC ............ *G06F 1/08* (2013.01); *H03K 17/6872* (2013.01); *H03K 17/6874* (2013.01)

(58) Field of Classification Search
CPC ... G06F 1/08; H03K 17/6872; H03K 17/6874
USPC ........................................................ 327/295
See application file for complete search history.

(56) References Cited

U.S. PATENT DOCUMENTS 6,956,426 B2 * 10/2005 Wodnicki ............. H03K 17/102
   323/315
2010/0214006 A1   8/2010 Hanazawa et al.
2012/0249210 A1 * 10/2012 Shimizu ............. H03K 17/6874
   327/333
2015/0014779 A1   1/2015 Jennings et al.
2016/0285446 A1   9/2016 Snowdon et al.

FOREIGN PATENT DOCUMENTS

JP        2012-209763 A     10/2012

OTHER PUBLICATIONS

Extended European Search Report in Europe Application No. 20202267.9, dated Mar. 2, 2021, 7 pages.

* cited by examiner

*Primary Examiner* — Tomi Skibinski
(74) *Attorney, Agent, or Firm* — Brinks Gilson & Lione

(57) ABSTRACT

The analog switch includes: a clock generation circuit configured to generate a first clock and a second clock; a transfer circuit including an NMOS transistor having a source and a back gate connected to each other, and a PMOS transistor having a source and a back gate connected to each other, one of which has a drain connected to the source of the other, and a source connected to a signal input terminal, and the other of which has a drain connected to a signal output terminal; a first control signal generation circuit configured to generate a control signal for switching the PMOS transistor based on a voltage at the signal input terminal and the first clock; and a second control signal generation circuit configured to generate a control signal for switching the NMOS transistor based on the voltage at the signal input terminal and the second clock.

14 Claims, 15 Drawing Sheets

ANALOG SWITCH

RELATED APPLICATIONS

This application claims priority to Japanese Patent Application No. 2019-191404, filed on Oct. 18, 2019, the entire content of which is incorporated herein by reference.

BACKGROUND OF THE INVENTION

1. Field of the Invention

The present invention relates to an analog switch.

2. Description of the Related Art

As an example of an analog switch configured to transmit an electric signal, there is known an analog switch using a MOS transistor which is a semiconductor element. The analog switch using the MOS transistor is configured to switch a signal having a signal voltage in a range of from about several V to about 1,000 V depending on its use. In a case where the voltage of the signal to be switched is relatively high such as 100 V, the analog switch is formed of a MOS transistor having a withstand voltage that is equal to or higher than the signal voltage. Analog switches each formed of such a MOS transistor having a relatively high withstand voltage are described in, for example, Japanese Patent Application Laid-open No. 2012-209763.

FIG. 14A is a circuit diagram for illustrating a configuration of an analog switch 100. FIG. 14B is a timing chart for illustrating states of control signals and on/off-states of a MOS transfer circuit 130 in the analog switch 100 as a first configuration example of the analog switch in the related art.

The analog switch 100 is substantially the same configuration as that of one of the analog switches described in Japanese Patent Application Laid-open No. 2012-209763, and includes a drive circuit 120, a holding circuit 110, and the MOS transfer circuit 130.

The drive circuit 120 includes PMOS transistors M5 and M6, and diodes D1 and D2. The PMOS transistor M5 has a source and a back gate connected to a power supply line 151, through which a power supply voltage VDD is supplied. The PMOS transistor M5 has a drain connected to an anode of the diode D1. The PMOS transistor M6 has a source and a back gate connected to the power supply line 151. The PMOS transistor M6 has a drain connected to an anode of the diode D2. To a gate of the PMOS transistor M5, a clock DON is supplied as a control signal. To a gate of the PMOS transistor M6, a clock ΦOFF is supplied as a control signal.

The holding circuit 110 includes NMOS transistors M3 and M4, Zener diodes D3 and D4, and capacitors C1 and C2. Each of the NMOS transistors M3 and M4 has a back gate and a source connected to each other (short-circuited). The sources respectively short-circuited to the back gates are connected to each other, and are further connected to one ends of the capacitors C1 and C2, and to anodes of the Zener diodes D3 and D4.

The NMOS transistor M3 has a drain connected to the other end of the capacitor C1, a cathode of the diode D1, a cathode of the Zener diode D4, and a gate of the NMOS transistor M4. The NMOS transistor M4 has a drain connected to the other end of the capacitor C2, a cathode of the diode D2, a cathode of the Zener diode D3, and a gate of the NMOS transistor M3.

The MOS transfer circuit 130 includes two NMOS transistors M1 and M2 each having a back gate and a source connected to each other (short-circuited), a terminal Vio1, and a terminal Vio2. The source of the NMOS transistor M1 and the source of the NMOS transistor M2 are connected in series with each other. Further, the sources of the NMOS transistors M1 and M2 are connected to the anodes of the Zener diodes D3 and D4, the sources of the NMOS transistors M3 and M4, and the one ends of the capacitors C1 and C2.

The NMOS transistor M1 has a drain connected to the terminal Vio1. The NMOS transistor M1 has a gate connected to a gate of the NMOS transistor M2, the drain of the NMOS transistor M3, the other end of the capacitor C1, the cathode of the Zener diode D4, the gate of the NMOS transistor M4, and the cathode of the diode D1. The NMOS transistor M2 has a drain connected to the terminal Vio2.

Each of the clocks ΦON and ΦOFF is a periodic signal having a low level and a high level. Each of the clocks ΦON and ΦOFF transitions from the high level to the low level for a predetermined period of time, and then transitions to the high level. Each of the clocks ΦON and ΦOFF is at the high level in an initial state. Further, the clocks ΦON and ΦOFF transition to the low level at different timings, and are adjusted so as not to be at the low level at the same time.

Operation of the analog switch 100 is described. In response to the clock ΦON transition from the initial state to the low level, the PMOS transistor M5 is turned on, and the power supply voltage VDD is applied to the holding circuit 110, more specifically, to the gate of the NMOS transistor M4 via the diode D1. The NMOS transistor M4 receives the power supply voltage VDD via the diode D1, and is thereby turned on. In the NMOS transistor M4 is the on-state, gate voltages of the NMOS transistors M1 and M2 are increased. Each of gate voltages of the NMOS transistors M1 and M2 become higher than threshold voltages of the NMOS transistors M1 and M2, thereby turning on the NMOS transistors M1 and M2. In response to turning on the NMOS transistors M1 and M2, the MOS transfer circuit 130 transits to an on-state.

Subsequently, the clock ΦON transition from the low level to the high level leads to turning off the PMOS transistor M5. In response to turning off the PMOS transistor M5, the holding circuit 110 is electrically disconnected from the drive circuit 120. Even after the holding circuit 110 is electrically disconnected from the drive circuit 120, an output voltage of the holding circuit 110 is held by the capacitors C1 and C2. Thus, the MOS transfer circuit 130 maintains the on-state.

Thereafter, the clock ΦOFF transits from the high level to the low level, the PMOS transistor M6 is turned on, and the power supply voltage VDD is applied to the holding circuit 110, more specifically, to the gate of the NMOS transistor M3 via the diode D2. In response to turning on the NMOS transistor M3, the gate voltages of the NMOS transistors M1 and M2 are reduced, and then become lower than the threshold voltages of the NMOS transistors M1 and M2. Thus, each of the NMOS transistors M1 and M2 are turned off, the MOS transfer circuit 130 transits to the OFF state, and hereby the electrical connection between the terminal Vio1 and the terminal Vio2 is disconnected.

Thereafter, in response to the clock ΦOFF transition from the low level to the high level, the PMOS transistor M6 is turned off, and thus the holding circuit 110 is electrically disconnected from the drive circuit 120. Even after the holding circuit 110 is electrically disconnected from the drive circuit 120, the output voltage of the holding circuit 110 is held by the capacitors C1 and C2. Thus, the MOS transfer circuit 130 maintains the OFF state.

In the analog switch 100 described above, in order to electrically connect or disconnect the terminal Vio1 and the terminal Vio2, it is required that the output voltage of the holding circuit 110 be sufficiently lower than the power supply voltage VDD in a state in which the PMOS transistor M5 or the PMOS transistor M6 is on. In this regard, from the viewpoint of further improving reliability of a switching operation in the MOS transfer circuit 130, there is proposed an analog switch 150 (see FIG. 15) obtained by adding a transistor M7 to the analog switch 100.

The transistor M7 has a drain connected to the drain of the transistor M2 and the terminal Vio2, and a source and a back gate connected to a ground line 152 (grounded). To a gate of the transistor M7, a clock $\Phi 0$ is supplied as a control signal. In the analog switch 150, substantially at the same time as the clock $\Phi ON$ or $\Phi OFF$ transitions to the low level and the transistor M5 or M6 is turned on, the gate signal $\Phi 0$ of the transistor M7 is set to a high level to turn on the transistor M7. Through this switching operation, the output voltage of the holding circuit 110 can be reduced to the level of a ground voltage VSS (<<VDD) supplied to the ground line 152. Thus, under a state in which the PMOS transistor M5 or M6 is on, the output voltage of the holding circuit 110 becomes sufficiently lower than the power supply voltage VDD.

However, a MOS transistor having a high withstand voltage is large in scale and amount of power consumption as compared to a MOS transistor having a relatively low withstand voltage. This means that the analog switch configured to switch a signal having a high signal voltage is relatively large in circuit scale and amount of power consumption.

SUMMARY OF THE INVENTION

It is an object of the present invention to provide an analog switch which is configured to switch a signal having a relatively high signal voltage without increasing circuit scale and amount of power consumption than a conventional analog switch.

In view of the above-mentioned circumstance, according to at least one embodiment of the present invention, there is provided an analog switch configured to connect or disconnect an electrical path between one terminal selected from at least one signal input terminal containing a first signal input terminal and one terminal selected from at least one signal output terminal containing a first signal output terminal, the analog switch including: a clock generation circuit configured to generate a plurality of clocks based on a reference clock supplied thereto, the plurality of clocks including a first clock and a second clock which is opposite in polarity to the first clock; a transfer circuit including: a first N-type transfer transistor which is an N-type field effect transistor having a source and a back gate connected to each other; and a first P-type transfer transistor which is a P-type field effect transistor having a source and a back gate connected to each other, of the first N-type transfer transistor and the first P-type transfer transistor, one transfer transistor having a drain connected to a source of another transfer transistor, the one transfer transistor having the source connected to the first signal input terminal, the another transfer transistor having a drain connected to the first signal output terminal; a first control signal generation circuit configured to generate a first control signal for controlling an on-state and an off-state of the first P-type transfer transistor based on a voltage at the first signal input terminal and the first clock; and a second control signal generation circuit configured to generate a second control signal for controlling an on-state and an off-state of the first N-type transfer transistor based on the voltage at the first signal input terminal and the second clock.

In view of the above-mentioned circumstance, according to at least one embodiment of the present invention, there is provided an analog switch configured to connect or disconnect an electrical path between one terminal selected from signal input terminals containing a first signal input terminal and a second signal input terminal and one terminal selected from signal output terminals containing a first signal output terminal and a second signal output terminal, the analog switch including: a clock generation circuit configured to generate a plurality of clocks based on a reference clock supplied thereto, the plurality of clocks including a first clock, a second clock which is opposite in polarity to the first clock, a third clock which is at a high level when the first clock is at a low level, and a fourth clock which is at a low level when the second clock is at a high level, and is opposite in polarity to the third clock; a transfer circuit including: a first N-type transfer transistor and a second N-type transfer transistor which are two N-type field effect transistors each having a source and a back gate connected to each other; and a first P-type transfer transistor and a second P-type transfer transistor which are two P-type field effect transistors each having a source and a back gate connected to each other; and a control signal generation circuit configured to generate a first control signal for controlling an on-state and an off-state of the first P-type transfer transistor based on a first voltage which is a voltage at the first signal input terminal and the first clock, generate a second control signal for controlling an on-state and an off-state of the first N-type transfer transistor based on the second input voltage which is the same voltage as or lower voltage than the first voltage and the second clock, generate a third control signal for controlling an on-state and an off-state of the second P-type transfer transistor based on the first input voltage and the third clock, and generate a fourth control signal for controlling an on-state and an off-state of the second N-type transfer transistor based on the second input voltage and the fourth clock, the control signal generation circuit including: a first output port configured to output the first control signal; a second output port configured to output the second control signal; a third output port configured to output the third control signal; and a fourth output port configured to output the fourth control signal, wherein the first P-type transfer transistor has the source and the back gate connected to the first signal input terminal, a drain connected to the first signal output terminal, and a gate connected to the first output port, wherein the second P-type transfer transistor has the source and the back gate connected to a connection point between the first signal input terminal, and the source and the back gate of the first P-type transfer transistor, a drain connected to the second signal output terminal, and a gate connected to the third output port, wherein the first N-type transfer transistor has the source and the back gate connected to the second signal input terminal, a drain connected to a connection point between the second signal output terminal and the drain of the second P-type transfer transistor, and a gate connected to the second output port, and wherein the second N-type transfer transistor has the source and the back gate connected to a connection point between the second signal input terminal, and the source and the back gate of the first N-type transfer transistor, a drain connected to a connection point between the first signal output terminal and the drain of the first P-type transfer transistor, and a gate connected to the fourth output port.

According to the analog switch of the embodiment, it is possible to provide the analog switch which is configured to switch the signal having the relatively high signal voltage without increasing circuit scale and amount of power consumption as compared to the conventional analog switch.

DETAILED DESCRIPTION OF THE PREFERRED EMBODIMENTS

Now, analog switches according to at least one embodiment of the present invention are described with reference to the drawings.

Each of the analog switches according to the at least one embodiment is configured to connect or disconnect an electrical path between one terminal selected from at least one signal input terminal containing a first signal input terminal and one terminal selected from at least one signal output terminal containing a first signal output terminal. First, of the analog switches according to the at least one embodiment, description is given of an analog switch including one signal input terminal as the at least one signal input terminal, to which a signal to be switched is supplied, and one signal output terminal as the at least one signal output terminal, from which a signal is output.

Figure 1A:
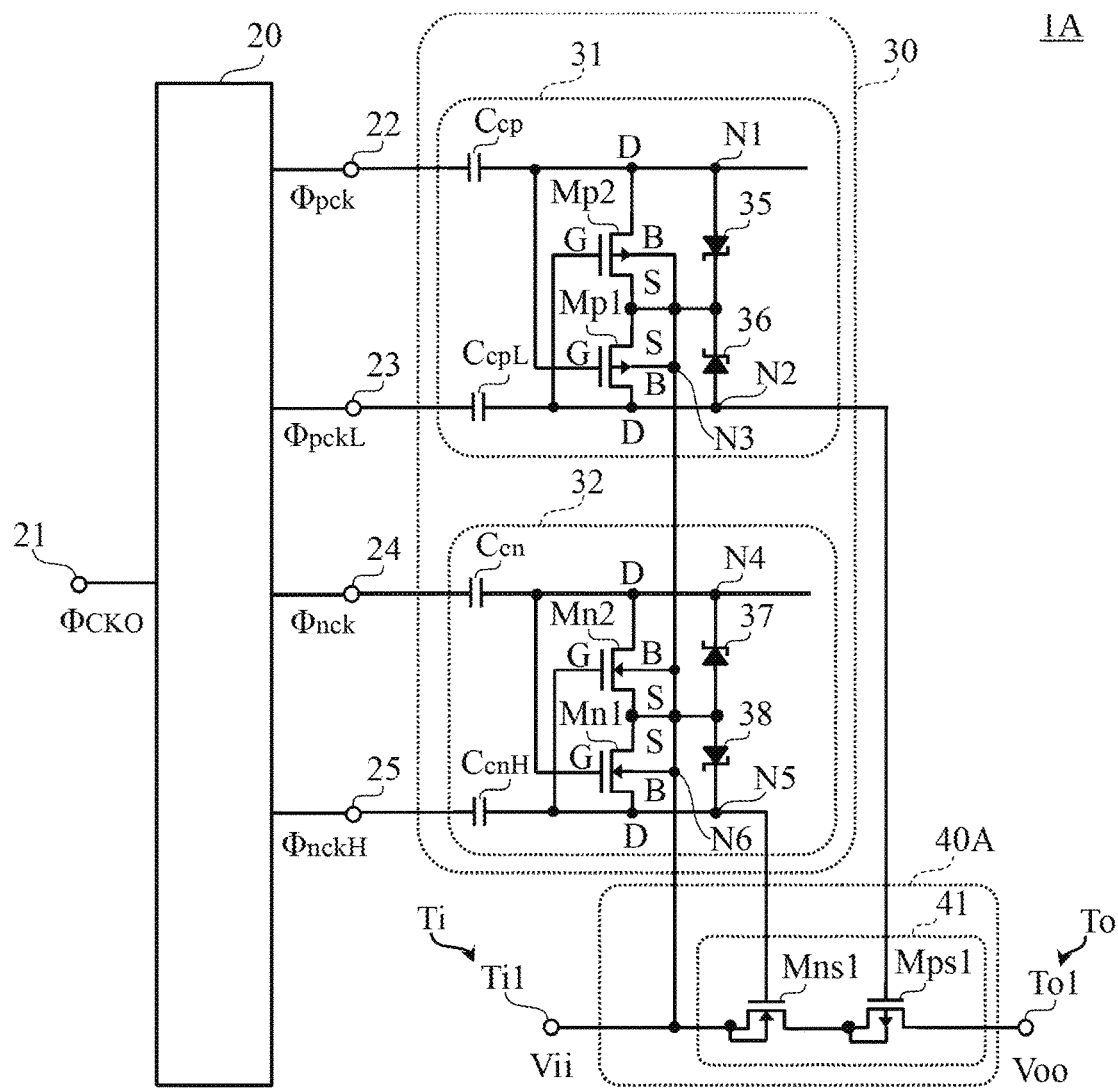
FIG. 1A is a circuit diagram for illustrating a first configuration example of an analog switch according to at least one embodiment of the present invention.
Figure 1B:
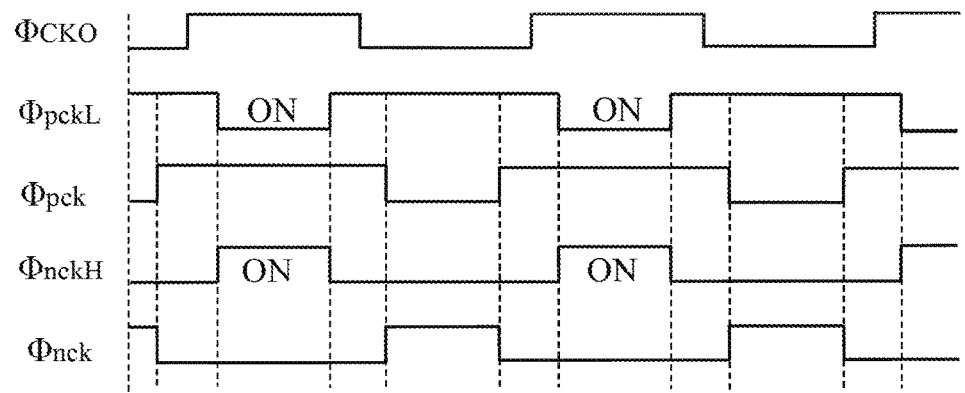
FIG. 1B is a timing chart of clocks in the first configuration example of the analog switch according to at least one embodiment of the present invention.

FIG. 1A is a circuit diagram for illustrating a configuration of an analog switch 1A, and FIG. 1B is a timing chart of clocks ΦCKO, Φpck, ΦpckL, Φnck, and ΦnckH in the analog switch 1A. Here, the analog switch 1A is first example of the analog switch according to the at least one embodiment.

The analog switch 1A includes a clock generation circuit 20, a clock bootstrap circuit 30, and a transfer circuit 40A.

The clock generation circuit 20 has a clock input terminal 21, and four clock output terminals 22, 23, 24, and 25. The clock bootstrap circuit 30 includes a step-down circuit 31 as a first control signal generation circuit, and a step-up circuit 32 as a second control signal generation circuit, and is configured to generate control signals for controlling on-states and off-states of field effect transistors (FETs). The transfer circuit 40A includes an NMOS transistor Mns1 as at least one N-type FET, and a PMOS transistor Mps1 as at least one P-type FET.

The clock generation circuit 20 is connected to the clock bootstrap circuit 30. The clock bootstrap circuit 30 is connected to the transfer circuit 40A.

To describe in more detail, the step-down circuit 31 is connected to the clock output terminals 22 and 23. Further, the step-down circuit 31 is connected to a gate of the PMOS transistor Mps1 as a first P-type transfer transistor. The step-up circuit 32 is connected to the clock output terminals 24 and 25. The step-up circuit 32 is also connected to a gate of the NMOS transistor Mns1 as a first N-type transfer transistor.

The step-down circuit 31 includes two capacitors Ccp and CcpL, PMOS transistors Mp1 and Mp2 which are two P-type FETs, and two Zener diodes 35 and 36.

The capacitor Ccp as a first capacitor has first end connected to the clock output terminal 22 as a first clock output terminal. The capacitor CcpL as a second capacitor has first end connected to the clock output terminal 23 as a second clock output terminal. The capacitor Ccp has the second end connected to a drain ("D" in FIG. 1A) of the PMOS transistor Mp2, and to a gate ("G" in FIG. 1A) of the PMOS transistor Mp1 as a first P-type FET. This connection point is hereinafter referred to as a "node N1".

The PMOS transistor Mp2 as a second P-type FET has a source ("S" in FIG. 1A) connected in series with a source of the PMOS transistor Mp1. Each of the PMOS transistors Mp1 and Mp2 has the source and a back gate ("B" in FIG. 1A) thereof connected to each other. In other words, the source and the back gate of the PMOS transistor Mp2, and the source and the back gate of the PMOS transistor Mp1 are connected to each other. This connection point is hereinafter referred to as a "node N3". The PMOS transistor Mp1 has a drain connected to the second end of the capacitor CcpL, and to a gate of the PMOS transistor Mp2. This connection point is hereinafter referred to as a "node N2".

Between the node N1 as a fourth node and the node N3 as a first node, the Zener diode 35 is further connected. The Zener diode 35 as a first Zener diode has an anode connected to the node N1, and a cathode connected to the node N3.

Further, between the node N2 as a third node and the node N3, the Zener diode 36 is further connected. The Zener diode 36 as a second Zener diode has an anode connected to the node N2, and a cathode connected to the node N3.

The step-down circuit 31 having the above-described configuration operates as a step-down circuit configured to step down and output a voltage supplied thereto. The step-down circuit 31 is configured to output control signals for controlling operation states of PMOS transistors, from the nodes N1 and N2. Withstand voltages of the capacitors Ccp and CcpL are selected in consideration of the voltage supplied to the step-down circuit 31.

The step-up circuit 32 includes two capacitors Ccn and CcnH, NMOS transistors Mn1 and Mn2 which are two N-type FETs, and two Zener diodes 37 and 38.

The capacitor Ccn as a third capacitor has first end connected to the clock output terminal 24 as a third clock output terminal. The capacitor CcnH as a fourth capacitor has first end connected to the clock output terminal 25 as a fourth clock output terminal. The capacitor Ccn has the second end connected to a drain of the NMOS transistor Mn2 as a second N-type FET, and to a gate of the NMOS transistor Mn1 as a first N-type FET. This connection point is hereinafter referred to as a "node N4".

The NMOS transistor Mn2 has a source connected in series with a source of the NMOS transistor Mn1. Each of the NMOS transistors Mn1 and Mn2 has the source and a back gate thereof connected to each other. In other words, the source and the back gate of the NMOS transistor Mn2, and the source and the back gate of the NMOS transistor Mn1 are connected to each other. This connection point is hereinafter referred to as a "node N6". The NMOS transistor Mn1 has a drain connected to the second end of the capacitor CcnH, and to a gate of the NMOS transistor Mn2. This connection point is hereinafter referred to as a "node N5".

Between the node N4 as a sixth node and the node N6 as a second node, the Zener diode 37 is further connected. The Zener diode 37 as a third Zener diode has an anode connected to the node N6, and a cathode connected to the node N4. Similarly, between the node N5 as a fifth node and the node N6, the Zener diode 38 is further connected. The Zener diode 38 as a fourth Zener diode has an anode connected to the node N6, and a cathode connected to the node N5.

The step-up circuit 32 having the above-described configuration operates as a step-up circuit configured to step up and output a voltage supplied thereto. The step-up circuit 32 is configured to output control signals for controlling operation states of NMOS transistors, from the nodes N4 and N5. Withstand voltages of the capacitors Ccn and CcnH are selected in consideration of the voltage supplied to the step-up circuit 32.

Further, the step-down circuit 31 and the step-up circuit 32 are connected to each other at the node N3 and the node N6. Further, the node N3 and the node N6 are connected to a connection point between a signal input terminal Ti1 and a source of the NMOS transistor Mns1. Thus, the node N3, the node N6, the signal input terminal Ti1, and the source of the NMOS transistor Mns1 form the same node.

The transfer circuit 40A includes a transfer element 41 including one NMOS transistor Mns1 and one PMOS transistor Mps1. In the transfer element 41, the NMOS transistor Mns1 and the PMOS transistor Mps1 are connected in series with each other. Further, each of the NMOS transistor Mns1 and the PMOS transistor Mps1 has a source and a back gate thereof connected to each other.

The NMOS transistor Mns1 has the source connected to the signal input terminal Ti1 and the back gate of the NMOS transistor Mn1. The NMOS transistor Mns1 has a drain connected to the source of the PMOS transistor Mps1. The PMOS transistor Mps1 has a drain connected to a signal output terminal To1. The NMOS transistor Mns1 has the gate connected to the cathode of the Zener diode 38, the drain of the NMOS transistor Mn1, the gate of the NMOS transistor Mn2, and the second end of the capacitor CcnH. The PMOS transistor Mps1 has the gate connected to the anode of the Zener diode 36, the drain of the PMOS transistor Mp1, the gate of the PMOS transistor Mp2, and the second end of the capacitor CcpL.

Subsequently, operation of the analog switch 1A is described.

In the analog switch 1A, based on the control signals supplied to the transfer circuit 40A, on/off-states of the PMOS transistor Mps1 and the NMOS transistor Mns1 as transfer transistors are controlled. The analog switch 1A is configured to switch between a connected state and a disconnected state through the control of the on/off-states of the PMOS transistor Mps1 and the NMOS transistor Mns1. In the connected state, the electrical path between one terminal included in a signal input unit Ti as the at least one signal input terminal and one terminal included in a signal output unit To as the at least one signal output terminal is established. In the disconnected state, the electrical path between one terminal included in the signal input unit Ti and one terminal included in the signal output unit To is disconnected. In the analog switch 1A, the electrical path is connected or disconnected between the signal input terminal Ti1 and the signal output terminal To1.

In the clock generation circuit 20, the clock ΦCKO used as a reference clock is supplied from the clock input terminal 21. The clock generation circuit 20 is configured to generate, based on the clock ΦCKO, a plurality of different clocks including the clocks Φpck, ΦpckL, Φnck, and ΦnckH.

The clocks Φpck, ΦpckL, Φnck, and ΦnckH transition between signal levels of a high level (hereinafter referred to as "H level") and a low level (hereinafter referred to as "L level") at timings illustrated in FIG. 1B.

More specifically, the clock Φpck as a first clock and the clock ΦpckL as a second clock are generated at timings at which the clock Φpck and the clock ΦpckL are not at the L level in the same period. In other words, the clock ΦpckL is at the H level in a period in which the clock Φpck is at the L level. Meanwhile, the clock Φnck as a third clock and the clock ΦnckH as a fourth clock are generated at timings at which the clock Φnck and the clock ΦnckH are not at the H level at the same time. In other words, the clock ΦnckH is at the L level in a period in which the clock Φnck is at the H level.

Further, the clocks Φpck and Φnck are generated at timings at which the clocks Φpck and Φnck have opposite polarities. Further, the clocks ΦpckL and ΦnckH are generated at timings at which the clocks ΦpckL and ΦnckH have opposite polarities. Each of the clocks ΦCKO, Φpck, ΦpckL, Φnck, and ΦnckH is a voltage having a voltage difference between the H level and the L level of less than 10 V (single-digit volts), for example, 5 V. In relation to the NMOS transistor Mns1 and the PMOS transistor Mps1, the voltage is set to be equal or higher than threshold voltages to switch the NMOS transistor Mns1 and the PMOS transistor Mps1 between the on-state and the off-state, and to be equal to or lower than withstand voltages of the NMOS transistor Mns1 and the PMOS transistor Mps1.

The clocks Φpck, ΦpckL, Φnck, and ΦnckH generated by the clock generation circuit 20 are output from the clock output terminals 22, 23, 24, and 25, respectively, and applied to the gates of the PMOS transistor Mp1, the PMOS transistor Mp2, the NMOS transistor Mn1, and the NMOS transistor Mn2, respectively.

In the step-down circuit 31, a voltage Vii of the signal input unit Ti is applied to the sources and the back gates of the PMOS transistors Mp1 and Mp2. The PMOS transistors Mp1 and Mp2 operate exclusively by the clocks Φpck and ΦpckL supplied thereto. In other words, the PMOS transistor Mp2 is in an off-state when the PMOS transistor Mp1 is in an on-state, and the PMOS transistor Mp1 is in an off-state when the PMOS transistor Mp2 is in an on-state. The PMOS transistors Mp1 and Mp2 are allowed to be in the off-state in the same period.

With the above-described operation, a voltage between the nodes N1 and N2 is controlled between the voltage Vii as a reference voltage and a voltage (hereinafter referred to as "down-adjusted voltage") obtained by stepping down a voltage with respect to the reference voltage. In other words, the step-down circuit 31 is configured to generate, based on the voltage Vii and the voltages of the clocks Φpck and ΦpckL, a signal with the voltage Vii used as the reference voltage being the H level as a first level, and with the down-adjusted voltage being the L level as a second level. In the step-down circuit 31 illustrated in FIGS. 1A and 1B, the generated signal is output as a first control signal having two different voltage levels from the node N2, and is supplied to the gate of the PMOS transistor Mps1.

In the step-up circuit 32, the voltage Vii is applied to the sources and the back gates of the NMOS transistors Mn1 and Mn2. The NMOS transistors Mn1 and Mn2 operate exclusively by the clocks Φnck and ΦnckH supplied thereto. In other words, the NMOS transistor Mn2 is in an off-state when the NMOS transistor Mn1 is in an on-state, and the NMOS transistor Mn1 is in an off-state when the NMOS transistor Mn2 is in an on-state. The NMOS transistors Mn1 and Mn2 are allowed to be in the off-state in the same period.

With the above-described operation, a voltage between the nodes N4 and N5 is controlled between the voltage Vii as a reference voltage and a voltage (hereinafter referred to as "up-adjusted voltage") obtained by stepping up a voltage with respect to the reference voltage. In other words, the step-up circuit 32 is configured to generate, based on the voltage Vii and the voltages of the clocks Φnck and ΦnckH, a signal with the voltage Vii used as the reference voltage being the L level as a first level, and with the up-adjusted voltage being the H level as a third level. In the step-up circuit 32 illustrated in FIGS. 1A and 1B, the generated signal is output as a second control signal having two different voltage levels from the node N5, and is supplied to the gate of the NMOS transistor Mns1.

The transfer circuit 40A functions as a switching device configured to switch between the connected state and the disconnected state with the control signals supplied from the clock bootstrap circuit 30. In the connected state, a signal supplied to the signal input unit Ti is output from the signal output unit To. Meanwhile, in the disconnected state, a signal supplied to the signal input unit Ti is not output from the signal output unit To.

In a period in which the clock ΦpckL is at the L level and the clock (nckH is at the H level, a signal of the H level is applied to the gate of the NMOS transistor Mns1, and a signal of the L level is applied to the gate of the PMOS transistor Mps1. As a result, the NMOS transistor Mns1 transits to the on-state with a gate voltage thereof being increased to exceed the threshold voltage of the NMOS transistor Mns1. Further, the PMOS transistor Mps1 transits to the on-state with a gate voltage thereof being reduced to exceed the threshold voltage of the PMOS transistor Mps1. Thus, in the transfer circuit 40A, the signal input unit Ti and the signal output unit To conduct in the period in which the clock ΦpckL is at the L level and the clock ΦnckH is at the H level. In other words, the transfer circuit 40A transits to the connected state.

In contrast, in the transfer circuit 40A, in a period other than the above-described period, specifically, in a period in which a voltage that is equal to the voltage Vii is applied to the gates of the NMOS transistor Mns1 and the PMOS transistor Mps1, the NMOS transistor Mns1 transits to the off-state with the gate voltage thereof not exceeding the threshold voltage of the NMOS transistor Mns1. Further, the PMOS transistor Mps1 transits to the off-state with the gate voltage thereof not exceeding the threshold voltage of the PMOS transistor Mps1 In other words, the transfer circuit 40A transits to the disconnected state.

In the period in which the transfer circuit 40A is controlled to be in the disconnected state, when a voltage Voo applied to the signal output unit To is higher than the voltage Vii, the PMOS transistor Mps1 may transit from the off-state to the on-state in some cases. This is because, when the voltage Voo is higher than the voltage Vii, a parasitic diode included in the PMOS transistor Mps1 is in a forward direction, and hence a source potential of the PMOS transistor Mps1 is increased. However, even when the PMOS transistor Mps1 transits from the off-state to the on-state, the transfer circuit 40A can stably maintain the disconnected state. This is because the NMOS transistor Mns1 having the source and the back gate connected to the signal input terminal Ti1 stably maintains the off-state without being affected by the increased source potential of the PMOS transistor Mps1.

In the period in which the transfer circuit 40A is controlled to be in the disconnected state, under a state in which the PMOS transistor Mps1 is on, a gate-source voltage of the PMOS transistor Mps1 on an output side connected to the signal output unit To takes an absolute value of a difference between the voltage Vii and the voltage Voo, that is, an absolute value (=|Vii−Voo|) of a difference between an input voltage and an output voltage. Thus, as long as the absolute value |Vii−Voo| is equal to or lower than a gate-source withstand voltage of the PMOS transistor Mps1, for example, 100 V, the transfer circuit 40A can perform a switching operation even when the voltage Vii is a signal having a voltage that is sufficiently high as compared to the gate-source withstand voltage of the MOS transistor on the output side.

Figure 14A:
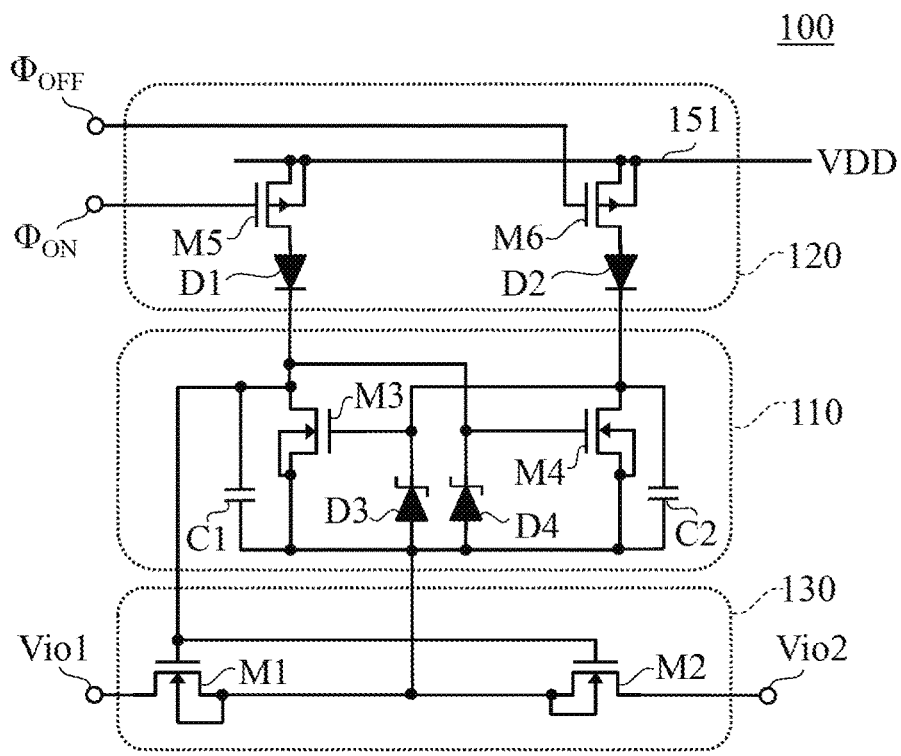
FIG. 14A is a circuit diagram for illustrating a first configuration example of an analog switch in a related art.
Figure 14B:
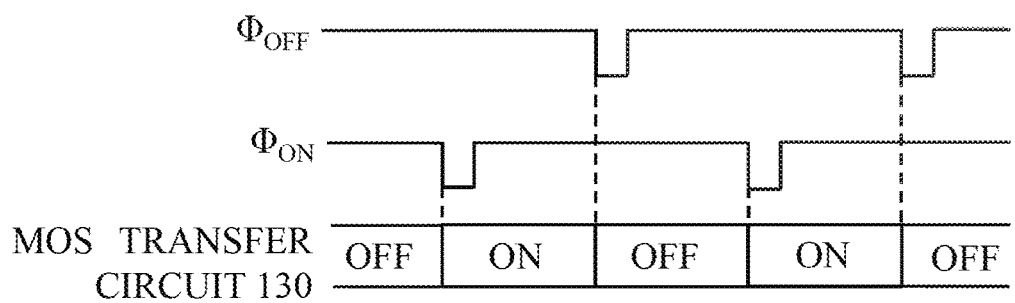
FIG. 14B is a timing chart for illustrating states of control signals and on/off-states of a MOS transfer circuit in the analog switch in the related art.
Figure 15:
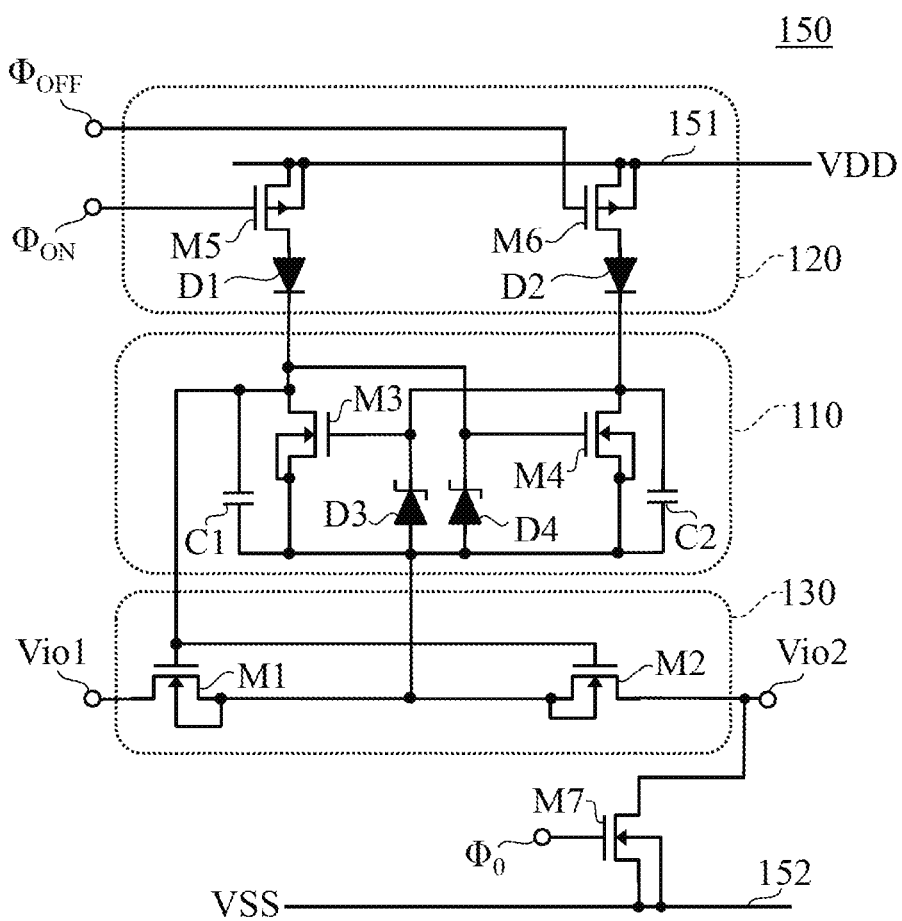
FIG. 15 is a circuit diagram for illustrating a second configuration example of the analog switch in the related art.

Stated reversely, even when the voltages Vii and Voo are voltages higher than the absolute value |Vii−Voo|, the analog switch 1A can select a transistor in consideration of a relatively low absolute value |Vii−Voo|. In contrast to the analog switches in the related art, which are formed of transistors each having a withstand voltage that is equal to or higher than a voltage of an analog signal to be connected or disconnected, such as the analog switches 100 and 150 (see FIGS. 14A, 14B, and 15), the analog switch 1A can be formed of transistors having relatively low withstand voltages. The analog switch 1A can be formed of the transistors having the relatively low withstand voltages in contrast to the analog switches in the related art, and hence can be reduced in circuit scale and amount of power consumption.

Further, the analog switch 1A can be formed without the configuration included in the analog switch 150 for applying a predetermined voltage such as a ground voltage VSS, that is sufficiently low with respect to a power supply voltage VDD, to a terminal of the MOS transfer circuit 130.

The analog switch 1A requires no configuration for and operation of applying the predetermined voltage to the signal input unit Ti or the signal output unit To, and hence the switching operation of the analog switch 1A can be performed at a higher speed than that of the analog switch 150. Further, with the analog switch 1A requiring no configuration for applying the predetermined voltage to the signal input unit Ti or the signal output unit To, a disturbance can be prevented from being superimposed on the analog signal through the configuration. In other words, the analog switch 1A can output the signal supplied from the signal input unit Ti from the signal output unit To with high accuracy.

Figure 2:
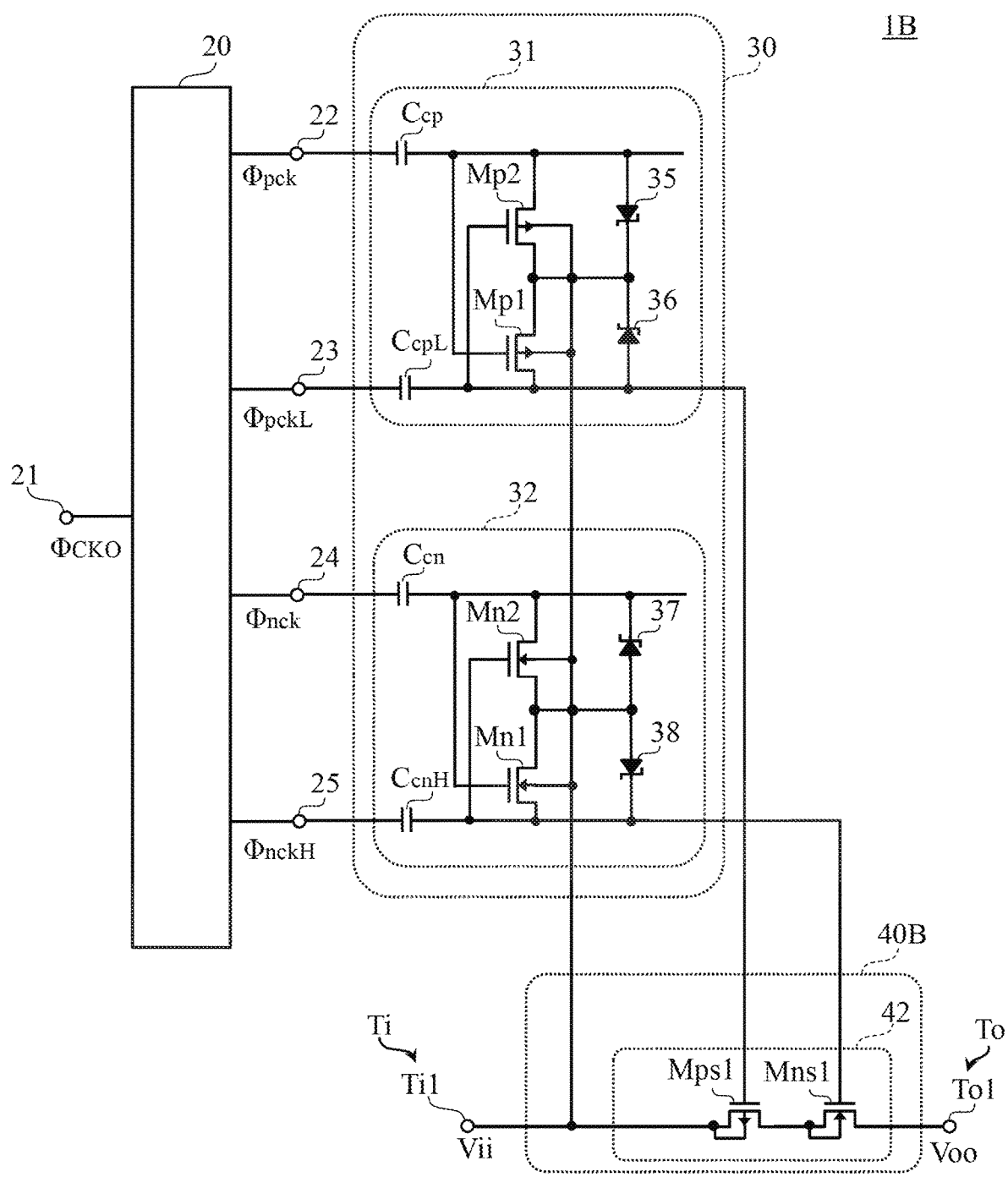
FIG. 2 is a circuit diagram for illustrating a second configuration example of the analog switch according to the at least one embodiment.

FIG. 2 is a circuit diagram for illustrating a configuration of an analog switch 1B which is second example of the analog switch according to the at least one embodiment.

The analog switch 1B is different from the analog switch 1A in including a transfer circuit 40B instead of the transfer circuit 40A, but is substantially the same as the analog switch 1A otherwise. The transfer circuit 40B is different from the transfer circuit 40A in a connection relationship between the NMOS transistor Mns1 and the PMOS transistor Mps1. In the transfer circuit 40B, the PMOS transistor Mps1 has the source connected to the signal input terminal Ti1, and has the drain connected to the source of the NMOS transistor Mns1. Further, the NMOS transistor Mns1 has the drain connected to the signal output terminal To1.

In the analog switch 1B, the node N3, the node N6, the signal input unit Ti, and the source of the PMOS transistor Mps1 form the same node. The analog switch 1B has the configuration different from that of the analog switch 1A, but operates in the same manner as the analog switch 1A.

In a period in which the analog switch 1B is controlled to be in the disconnected state, when the voltage Voo of the signal output unit To is lower than the voltage Vii applied to the signal input unit Ti, the NMOS transistor Mns1 may transit from off to on in some cases. This is because, when the voltage Voo is lower than the voltage Vii, a parasitic diode included in the NMOS transistor Mns1 is in a forward direction, and hence a source potential of the NMOS transistor Mns1 is reduced.

However, even when the NMOS transistor Mns1 transit from off to on, the transfer circuit 40B can stably maintain the disconnected state. This is because the PMOS transistor Mps1 having the source and the back gate connected to the signal input terminal Ti1 stably maintains the off-state without being affected by the reduced source potential of the NMOS transistor Mns1.

In the period in which the transfer circuit 40B is controlled to be in the disconnected state, under a state in which the NMOS transistor Mns1 is on, a gate-source voltage of the NMOS transistor Mns1 on an output side connected to the signal output unit To takes the absolute value |Vii−Voo|. Thus, as long as the absolute value |Vii−Voo| is equal to or lower than a gate-source withstand voltage of the NMOS transistor Mns1, the transfer circuit 40B can perform a switching operation even when the voltage Vii is a signal having a voltage that is sufficiently high as compared to the gate-source withstand voltage of the MOS transistor on the output side.

In the analog switches 1A and 1B, connection destinations of the gates of the PMOS transistor Mps1 and the NMOS transistor Mns1 are not limited to the connection destinations illustrated in FIG. 1A, FIG. 1B, and FIG. 2. The gates of the PMOS transistor Mps1 and the NMOS transistor Mns1 illustrated in FIG. 1A, FIG. 1B, and FIG. 2 may be connected to any destinations as long as the gates are in a relationship of being supplied with control signals of opposite polarities in which transits between the L level and the H level are made at the same timings. Thus, the connection destinations of the gates of the PMOS transistor Mps1 and the NMOS transistor Mns1 may be the node N1 and the node N4, respectively.

Next, description is given of an analog switch including one signal input terminal as the at least one signal input terminal and two signal output terminals as the at least one signal output terminal, that is, an analog switch including a signal input unit Ti containing a signal input terminal Ti1, and a signal output unit To containing signal output terminals To1 and To2.

Figure 3A:
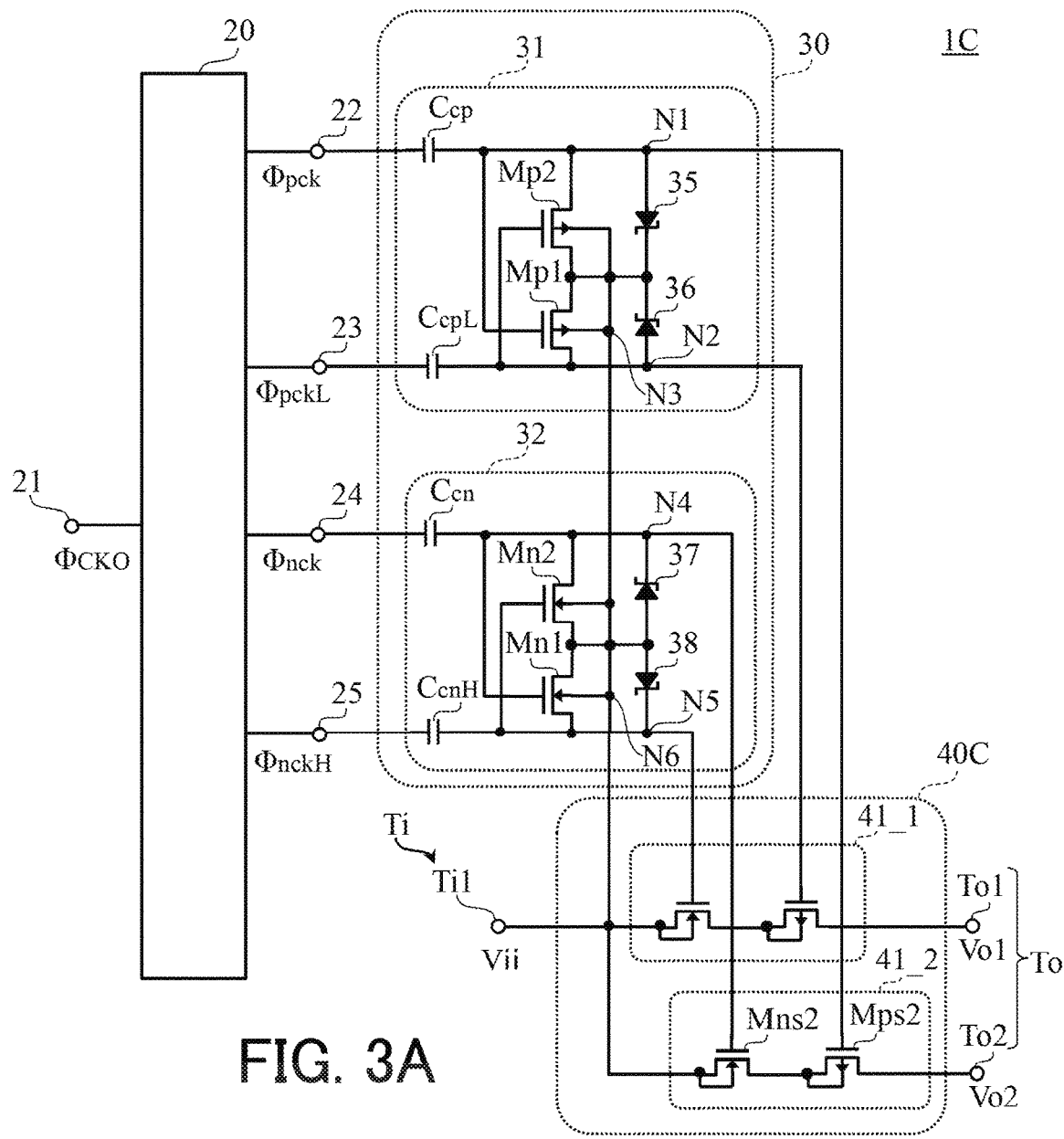
FIG. 3A is a circuit diagram for illustrating a third configuration example of the analog switch according to the at least one embodiment.
Figure 3B:
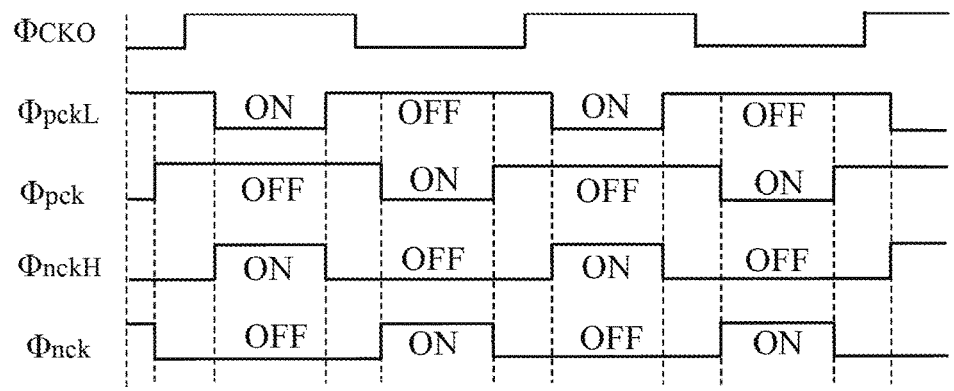
FIG. 3B is a timing chart of clocks in the third configuration example of the analog switch according to the at least one embodiment.

FIG. 3A is a circuit diagram for illustrating a configuration of an analog switch 1C which is third example of the analog switch according to the at least one embodiment, and FIG. 3B is a timing chart of clocks ΦCKO, Φpck, ΦpckL, Φnck, and ΦnckH in the analog switch 1C.

The analog switch 1C is different from the analog switch 1A in including a transfer circuit 40C instead of the transfer circuit 40A, and in a connection relationship between the clock bootstrap circuit 30 and the transfer circuit 40C, but is substantially the same as the analog switch 1A otherwise. Thus, in the following description of the analog switch 1C, the transfer circuit 40C is mainly described, and components that are substantially the same as those included in the analog switch 1A are denoted by the same reference symbols, and a duplicate description thereof is omitted.

The transfer circuit 40C includes transfer elements 41_1 and 41_2, each of which has a configuration similar to that of the transfer element 41. In other words, the transfer circuit 40C is formed by adding, to the transfer circuit 40A including one transfer element 41 (transfer element 411), another transfer element 41 (transfer element 41_2). The transfer element 41_2 is connected between the signal input terminal Ti1 and the signal output terminal To2.

A PMOS transistor Mps2 as a second P-type transfer transistor has a gate connected to the gate of the PMOS transistor Mp1, the drain of the PMOS transistor Mp2, and the anode of the Zener diode 35. In other words, the PMOS transistor Mps2 has the gate connected to the node N1.

An NMOS transistor Mns2 as a second N-type transfer transistor has a gate connected to the gate of the NMOS transistor Mn1, the drain of the NMOS transistor Mn2, and the cathode of the Zener diode 37. In other words, the NMOS transistor Mns2 has the gate connected to the node N4.

Subsequently, operation of the analog switch 1C is described.

In the analog switch 1C, based on the control signals supplied to the transfer circuit 40C, on/off-states of the PMOS transistors Mps1 and Mps2 and the NMOS transistors Mns1 and Mns2 are controlled. The analog switch 1C is configured to switch between a connected state and a disconnected state through the control of the on/off-states of the PMOS transistors Mps1 and Mps2 and the NMOS transistors Mns1 and Mns2.

Clocks (pck, ΦpckL, Φnck, and ΦnckH illustrated in FIG. 3B are clocks that transit between the H level and the L level at the same timings as those of the clocks Φpck, ΦpckL, Φnck, and ΦnckH illustrated in FIG. 1B.

The step-down circuit 31 is configured to generate, based on the voltage Vii and the voltages of the clocks Φpck and ΦpckL, signals with the voltage Vii used as the reference voltage being the H level, and with the down-adjusted voltage being the L level. The generated signals are output as control signals for controlling the on-states/off-states of the PMOS transistors Mps1 and Mps2 from the nodes N1 and N2, respectively. The signal output from the node N1 is supplied to the gate of the PMOS transistor Mps2. The signal output from the node N2 is supplied to the gate of the PMOS transistor Mps1.

As described above, in the analog switch 1C, two control signals for controlling the on-states/off-states of the PMOS transistors Mps1 and Mps2 are generated. The two generated control signals are supplied to the gates of the PMOS transistors Mps1 and Mps2 of the transfer circuit 40C, respectively.

The step-down circuit 32 is configured to generate, based on the voltage Vii and the voltages of the clocks ΦnckH and ΦnckH, signals with the voltage Vii used as the reference voltage being the L level, and with the up-adjusted voltage being the H level. The generated signals are output as control signals for controlling the on-states/off-states of the NMOS transistors Mns1 and Mns2 from the nodes N4 and N5, respectively. The signal output from the node N4 is supplied to the gate of the NMOS transistor Mns2. The signal output from the node N5 is supplied to the gate of the NMOS transistor Mns1.

As described above, in the analog switch 1C, two control signals for controlling the on-states/off-states of the NMOS transistors are generated. The two generated control signals are supplied to the gates of the NMOS transistors Mns1 and Mns2 of the transfer circuit 40C, respectively.

The transfer circuit 40C functions as a switching device as with the transfer circuit 40A. In the connected state, the signal supplied to the signal input unit Ti is output from the signal output terminal To1 as a first signal output terminal or the signal output terminal To2 as a second signal output terminal. Meanwhile, in the disconnected state, the signal supplied to the signal input unit Ti is not output from the signal output terminal To1 or the signal output terminal To2.

In the transfer circuit 40C, the signal input unit Ti and the signal output terminal To1 conduct in the period in which the clock ΦpckL is at the L level and the clock ΦnckH is at the H level. In the transfer circuit 40C, the signal input unit Ti and the signal output terminal To2 conduct in the period in which the clock Φpck is at the L level and the clock (nck is at the H level. The above-described state in which the signal input unit Ti and the signal output terminal To1 or the signal output terminal To2 conduct is the connected state of the transfer circuit 40C. The transfer circuit 40C transits to the disconnected state in a period other than the above-described periods, specifically, in a period in which a voltage that is equal to the voltage Vii is applied to the gates of the NMOS transistors Mns1 and Mns2, and of the PMOS transistors Mps1 and Mps2.

With the analog switch 1C described above, effects similar to those of the analog switch 1A can be obtained. Further, in outputting the signal supplied to the signal input unit Ti from the signal output unit To, the analog switch 1C can output the signal from the signal output terminal To1 or the signal output terminal To2 in a switching manner.

Figure 4:
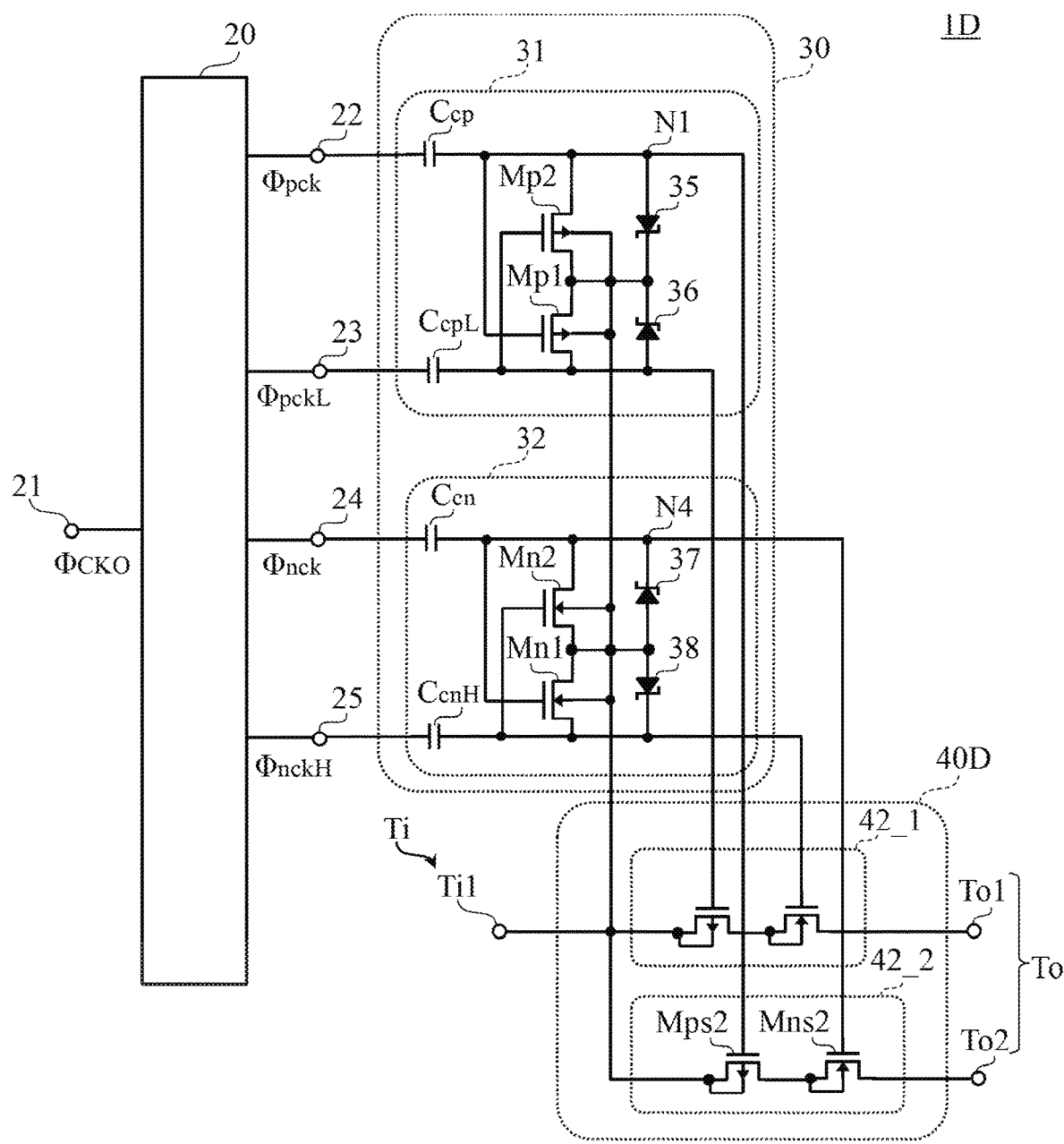
FIG. 4 is a circuit diagram for illustrating a fourth configuration example of the analog switch according to the at least one embodiment.
Figure 5:
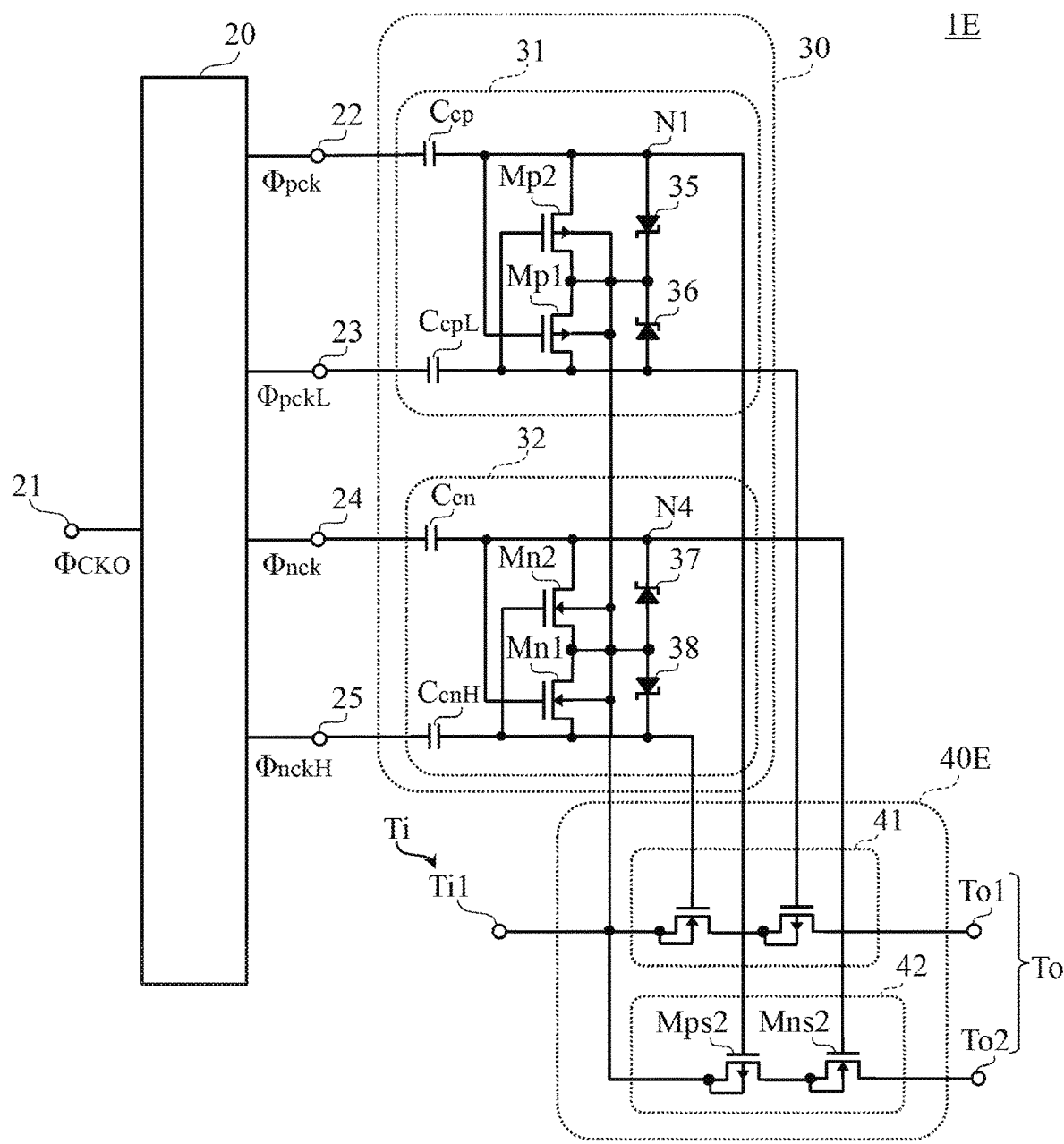
FIG. 5 is a circuit diagram for illustrating a fifth configuration example of the analog switch according to the at least one embodiment.

FIG. 4 and FIG. 5 are circuit diagrams for illustrating configurations of an analog switch 1D and an analog switch 1E which are respectively fourth and fifth examples of the analog switches according to the at least one embodiment. In FIGS. 4 and 5, from the viewpoints of ensuring, for example, simplicity and clarity of the drawings, reference symbols denoting some of components corresponding to the components illustrated in FIGS. 1A to 3B are omitted from the illustration.

The analog switch 1D is different from the analog switch 1B in including a transfer circuit 40D instead of the transfer circuit 40B, and in a connection relationship between the clock bootstrap circuit 30 and the transfer circuit 40D, but is substantially the same as the analog switch 1B otherwise. Thus, in the description of the analog switch 1D, the transfer circuit 40D is mainly described, and components that are substantially the same as those included in the analog switches 1A and 1B are denoted by the same reference symbols, and a duplicate description thereof is omitted.

The transfer circuit 40D further includes transfer elements 42_1 and 42_2, each of which has a configuration similar to that of the transfer element 42. In other words, the transfer circuit 40D is formed by adding, to the transfer circuit 40B including one transfer element 42 (transfer element 42_1), another transfer element 42 (transfer element 42_2). The transfer element 42_2 is connected between the signal input terminal Ti1 and the signal output terminal To2.

In regard to the transfer element 422, the PMOS transistor Mps2 has a source connected to the source of the PMOS transistor Mps1, the signal input terminal Ti1, and the nodes N3 and N6. The PMOS transistor Mps2 has a gate connected to the node N1. Further, the NMOS transistor Mns2 has a drain connected to the signal output terminal To2. The NMOS transistor Mns2 has a gate connected to the node N4.

The analog switch 1D having the above-described configuration can be said to include, with respect to the analog switch 1C, the transfer circuit 40D including the transfer elements 42_1 and 42_2 instead of the transfer circuit 40C including the transfer elements 41_1 and 41_2.

The analog switch 1E is different from the analog switch 1C in including a transfer circuit 40E instead of the transfer circuit 40C, but is substantially the same as the analog switch 1C otherwise. More specifically, the transfer circuit 40E is different from the transfer circuit 40C in including the transfer element 42 instead of the transfer element 41_2, but is substantially the same as the transfer circuit 40C otherwise.

Each of the analog switches 1D and 1E operates in a similar manner as the analog switch 1C, and hence can perform a switching operation similar to that of the analog switch 1C. Further, with the analog switches 1D and 1E, effects similar to those of the analog switch 1C can be obtained.

In the analog switches 1C to 1E, connection destinations of the gates of the PMOS transistors Mps1 and Mps2, and of the NMOS transistors Mns1 and Mns2 are not limited to the connection destinations illustrated in FIGS. 3A to 5. The gates of the PMOS transistor Mps1 and the NMOS transistor Mns1, and the gates of the PMOS transistor Mps2 and the NMOS transistor Mns2 illustrated in FIGS. 3A to 5 may be connected to any destinations as long as the gates are in a relationship of being supplied with control signals of opposite polarities in which transits between the L level and the H level are made at the same timings. Further, the gates of the PMOS transistors Mps1 and Mps2 may be connected to any destinations as long as the gates are in a relationship in which, in a period in which one control signal is at the L level, the other control signal is at the H level. Further, the gates of the NMOS transistors Mns1 and Mns2 may be connected to any destinations as long as the gates are in a relationship in which, in a period in which the one control signal is at the H level, the other control signal is at the L level. Thus, the connection destinations of the gates of the PMOS transistors Mps1 and Mps2, and of the NMOS transistors Mns1 and Mns2 may be the nodes N1 and N2, and the nodes N4 and N5, respectively.

Next, description is given of an analog switch including two signal input terminals as the at least one signal input terminal, and one signal output terminal as the at least one signal output terminal, that is, an analog switch including a signal input unit Ti containing signal input terminals Ti1 and Ti2, and a signal output unit To containing a signal output terminal To1.

Figure 6:
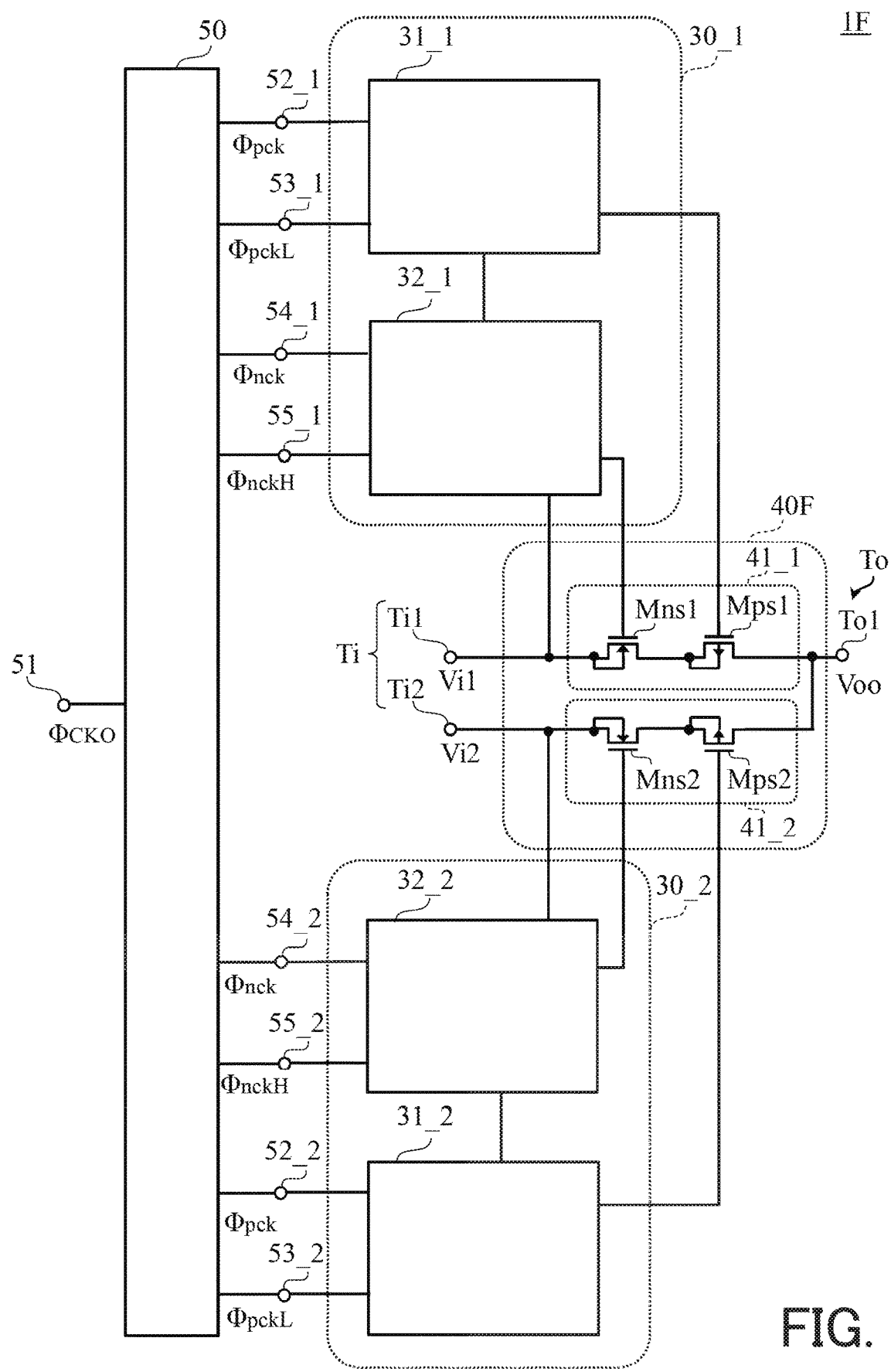
FIG. 6 is a circuit diagram for illustrating a sixth configuration example of the analog switch according to the at least one embodiment.

FIG. 6 is a circuit diagram for illustrating a configuration of an analog switch 1F which is sixth example of the analog switch according to the at least one embodiment. In FIG. 6, step-down circuits 31_1 and 31_2, and step-up circuits 32_1 and 32_2, respectively, are illustrated in a simplified manner in view of a relation to the step-down circuit 31 and the step-up circuit 32.

The analog switch 1F includes substantially two (a pair of) analog switches 1A, and has a configuration in which one analog switch 1A has the signal output unit To connected to the signal output unit To of the other analog switch 1A, and to the drain of the PMOS transistor Mps1.

To describe specifically, the analog switch 1F includes a clock generation circuit 50 corresponding to a pair of clock generation circuits 20, clock bootstrap circuits 30_1 and 30_2 corresponding to a pair of clock bootstrap circuits 30, and a transfer circuit 40F including transfer elements 41_1 and 41_2 corresponding to a pair of transfer elements 41. The clock bootstrap circuit 30_1 includes a step-down circuit 31_1 and a step-up circuit 32_1. The clock bootstrap circuit 30_2 includes a step-down circuit 31_2 as a third control signal generation circuit, and a step-up circuit 32_2 as a fourth control signal generation circuit. Here, the step-down circuits 31_1 and 31_2 have substantially the same configuration as that of the step-down circuit 31. The step-up circuits 32_1 and 32_2 have substantially the same configuration as that of the step-up circuit 32.

The clock generation circuit 50 has one clock input terminal 51, two clock output terminals 52_1 and 52_2, two clock output terminals 53_1 and 53_2, two clock output terminals 54_1 and 54_2, and two clock output terminals 55_1 and 55_2. The clock input terminal 51 is a component corresponding to the clock input terminal 21, and is supplied with a clock ΦCKO. The clock output terminal 52_1 and the clock output terminal 52_2 are components corresponding to the clock output terminal 22, and are configured to output the clock Φpck. The clock output terminal 53_1 and the clock output terminal 53_2 are components corresponding to the clock output terminal 23, and are configured to output the clock ΦpckL. The clock output terminal 54_1 and the clock output terminal 54_2 are components corresponding to the clock output terminal 24, and are configured to output the clock Φnck. The clock output terminal 55_1 and the clock output terminal 55_2 are components corresponding to the clock output terminal 25, and are configured to output the clock ΦnckH.

The transfer circuit 40F includes the transfer element 41_1 and the transfer element 41_2. The PMOS transistors Mps1 and Mps2 have respectively a drain connected to the signal output terminal To1. The drain of the each PMOS transistor Mps1 and Mps2 is an output port of the each transfer element 41_1 and 41_2.

In the transfer circuit 40F, though illustration is omitted in FIG. 6, the gate of the NMOS transistor Mns1 and the gate of the PMOS transistor Mps1 are connected to the node N5 and the node N2 in the clock bootstrap circuit 30_1, respectively. Further, the NMOS transistor Mns2 and the PMOS transistor Mps2 are configured to operate exclusively with the NMOS transistor Mns1 and the PMOS transistor Mps1.

In a case where the gate of the NMOS transistor Mns1 is connected to the node N5 of the clock bootstrap circuit 30_1, the gate of the NMOS transistor Mns2 is connected to the node N4 (not shown) in the clock bootstrap circuit 30_2 as a tenth node.

In a case where the gate of the PMOS transistor Mps1 is connected to the node N2 of the clock bootstrap circuit 30_1, the gate of the PMOS transistor Mps2 is connected to the node N1 (not shown) in the clock bootstrap circuit 30_2 as an eighth node.

The analog switch 1F described above can be regarded as a pair of analog switches 1A: the analog switch 1A including the transfer element 41_1 and the analog switch 1A including the transfer element 41_2.

In the transfer element 41_1, to the gate of the PMOS transistor Mps1, a signal output from the node N2 of the clock bootstrap circuit 30_1 is supplied as a first control signal. Further, to the NMOS transistor Mns1, a signal output from the node N5 of the clock bootstrap circuit 30_1 is supplied as a second control signal. Meanwhile, in the transfer element 41_2, to the gate of the PMOS transistor Mps2, a signal output from the node N1 of the clock bootstrap circuit 30_2 is supplied as a third control signal. Further, to the NMOS transistor Mns2, a signal output from the node N4 of the clock bootstrap circuit 30_2 is supplied as a fourth control signal.

As described above, the analog switch 1F can be regarded to include a pair of analog switches 1A including the transfer elements 41_1 and 412, and hence effects similar to those of the analog switch 1A can be obtained.

Further, the transfer element 41_2 is configured to operate exclusively with the transfer element 41_1. Thus, in outputting the signal supplied to the signal input unit Ti from the signal output unit To, the analog switch 1F can output the signal supplied to the signal input terminal Ti1 or the signal supplied to the signal input terminal Ti2 in a switching manner.

Here, an input signal supplied to the signal input terminal Ti1 as a first signal input terminal is defined as a "voltage Vi1", and an input signal supplied to the signal input terminal Ti2 as a second signal input terminal is defined as a "voltage Vi2". In a case where the voltage Vi1 is equal to or higher than the voltage Vi2 (Vi1≥Vi2), the analog switch 1F can prevent, in a period in which the transfer circuit 40F is controlled to be in the disconnected state, PMOS transistors Mps1 and Mps2 from being turned on due to the effect of parasitic diodes included in the MOS transistors on the signal output unit To side, that is, the PMOS transistors Mps1 and Mps2 having drains connected to the signal output terminals To1 and To2. Thus, the analog switch 1F can suppress the power consumption further than the analog switches 1A to 1E.

In the analog switch 1F, connection destinations of the gates of the PMOS transistors Mps1 and Mps2, and of the NMOS transistors Mns1 and Mns2 are not limited to the connection destinations illustrated in FIG. 6. The connection destinations of the gates of the PMOS transistor Mps1 and the NMOS transistor Mns1 may be the node N1 of the clock bootstrap circuit 30_1 and the node N4 of the clock bootstrap circuit 30_1, respectively. In this connection destinations, connection destinations of the gates of the PMOS transistor Mps2 and the NMOS transistor Mns2 may be the node N2 of the clock bootstrap circuit 30_2 as a seventh node and the node N5 of the clock bootstrap circuit 302 as a ninth node, respectively.

Figure 7:
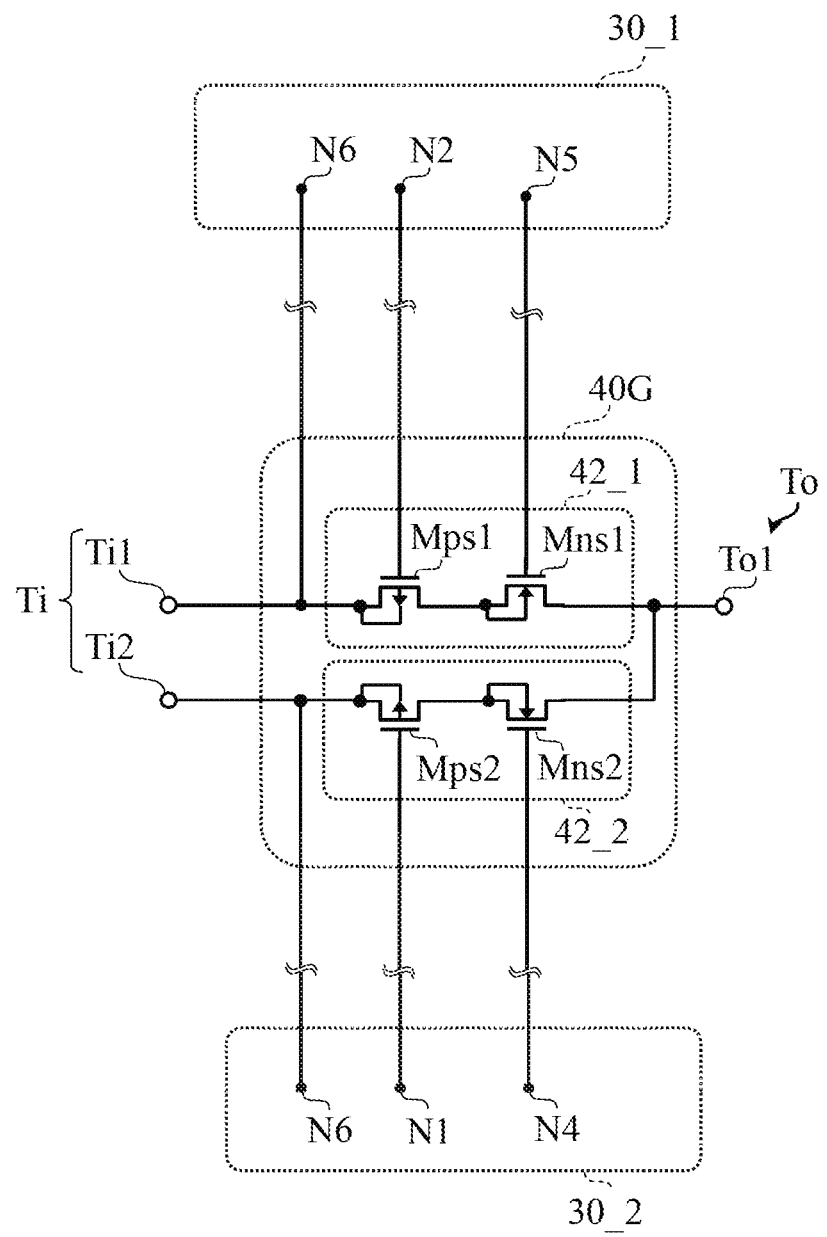
FIG. 7 is a circuit diagram for illustrating a seventh configuration example of the analog switch according to the at least one embodiment.
Figure 8:
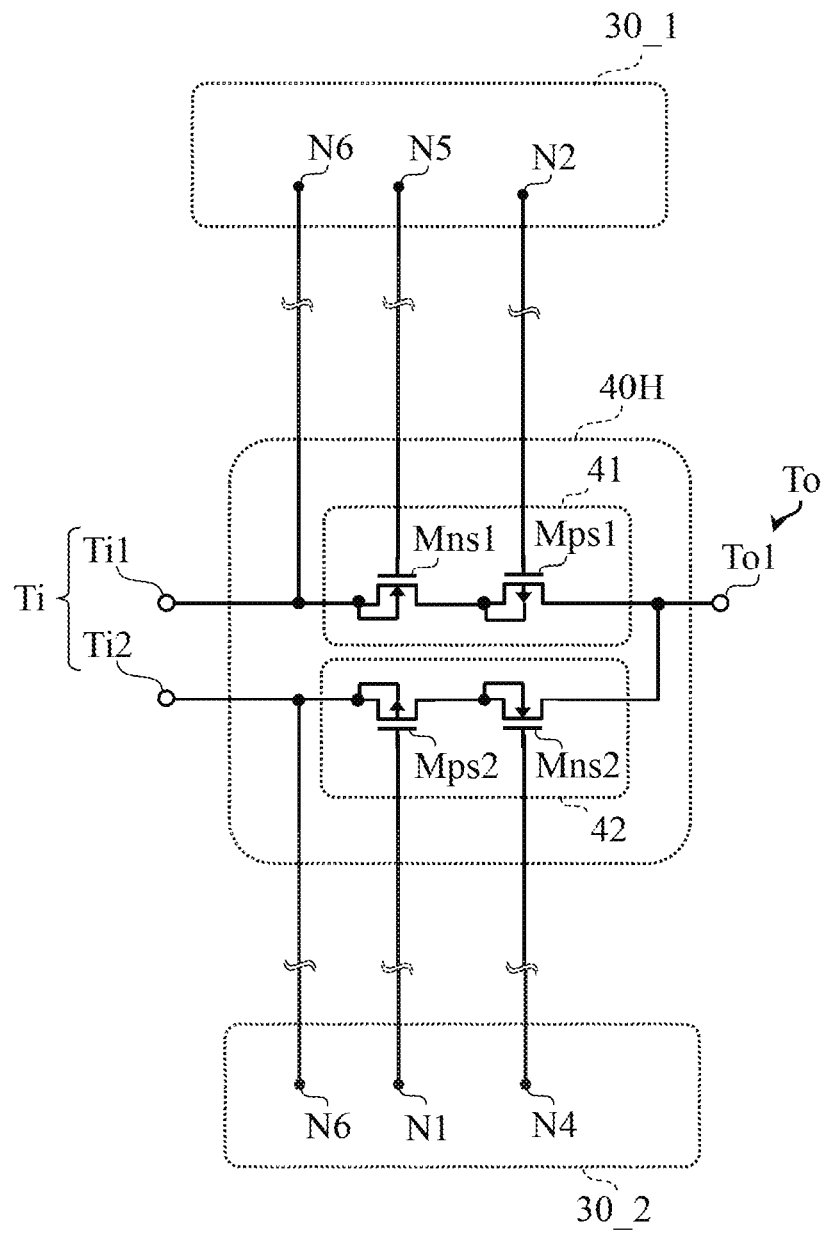
FIG. 8 is a circuit diagram for illustrating an eighth configuration example of the analog switch according to the at least one embodiment.

FIG. 7 is a circuit diagram for illustrating configuration of an analog switch 1G which is seventh example of the analog switch according to the at least one embodiment. FIG. 8 is a circuit diagrams for illustrating configuration of an analog switch 1H which is eighth example of the analog switch according to the at least one embodiment. The analog switch 1G in FIG. 7 and the analog switch 1H in FIG. 8 are illustrated with the clock generation circuit 50 and the clock bootstrap circuits 30_1 and 30_2, which are common to the analog switch 1F, being omitted.

The analog switch 1G includes substantially a pair of analog switches 1B, and has a configuration in which one analog switch 1B has the signal output unit To connected to the signal output unit To of the other analog switch 1B, and to the drain of the NMOS transistor Mns1. To describe specifically, the analog switch 1G includes the clock generation circuit 50, the clock bootstrap circuits 30_1 and 30_2, and a transfer circuit 40G including transfer elements 42_1 and 42_2 corresponding to a pair of transfer elements 42.

The analog switch 1H is different from the analog switch 1F in including a transfer circuit 40H instead of the transfer circuit 40F, but is substantially the same as the analog switch 1F otherwise. More specifically, the transfer circuit 40H is different from the transfer circuit 40F in including the transfer element 42 instead of the transfer element 41_2, but is substantially the same as the transfer circuit 40F otherwise.

Each of the analog switches 1G and 1H operates in a similar manner as the analog switch 1F, and hence can perform a switching operation similar to that of the analog switch 1F. Further, with the analog switches 1G and 1H, effects similar to those of the analog switch 1F can be obtained.

In the analog switches 1G and 1H, connection destinations of the gates of the PMOS transistors Mps1 and Mps2, and of the NMOS transistors Mns1 and Mns2 are not limited to the connection destinations illustrated in FIG. 7 and FIG. 8. In the analog switches 1G and 1H, as in the analog switch 1F, the connection destinations of the gates of the PMOS transistors Mps1 and Mps2, and of the NMOS transistors Mns1 and Mns2 may be the node N1 of the clock bootstrap circuit 301, the node N2 of the clock bootstrap circuit 30_2, the node N4 of the clock bootstrap circuit 30_1, and the node N5 of the clock bootstrap circuit 30_2, respectively.

Next, description is given of an analog switch including two signal input terminals as the at least one signal input terminal, and two signal output terminals as the at least signal output terminal, that is, an analog switch including a signal input unit Ti containing signal input terminals Ti1 and Ti2, and a signal output unit To containing signal output terminals To1 and To2.

Figure 9:
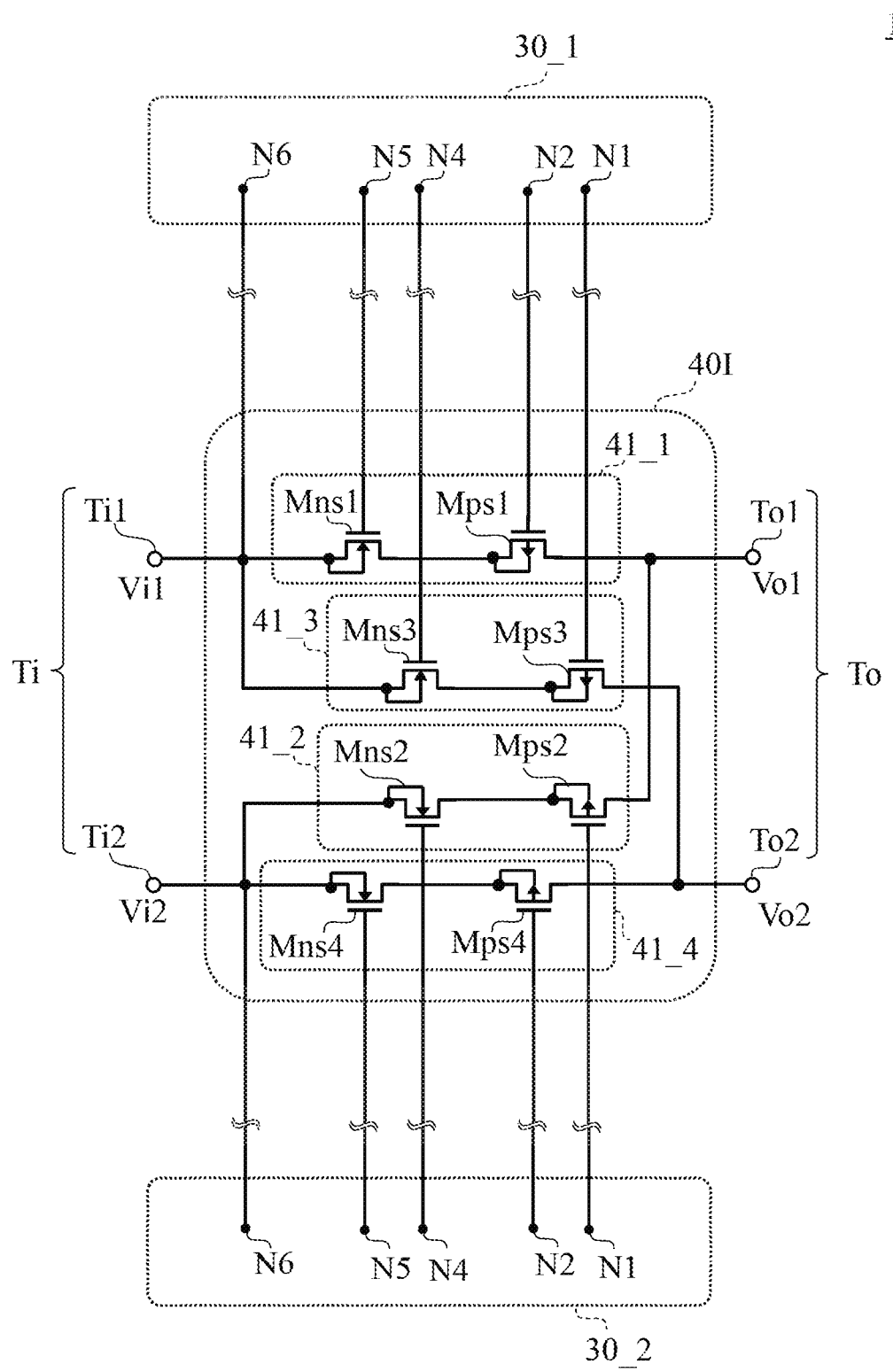
FIG. 9 is a circuit diagram for illustrating a ninth configuration example of the analog switch according to the at least one embodiment.

FIG. 9 is a circuit diagram for illustrating a configuration of an analog switch 1I which is ninth example of the analog switch according to the at least one embodiment. The analog switch 1I in FIG. 9 is illustrated with the components such as the clock generation circuit 50, which are common to the analog switch 1F, being partially omitted.

The analog switch 1I is different from the analog switch 1F in including a transfer circuit 40I instead of the transfer circuit 40F, but is substantially the same as the analog switch 1F otherwise. More specifically, the transfer circuit 40I further includes, with respect to the transfer circuit 40F, a signal output terminal To2, NMOS transistors Mns3 and Mns4, and the PMOS transistors Mps3 and Mps4.

The NMOS transistor Mns3 and the PMOS transistor Mps3 are connected in series with each other. These transistors Mns3 and Mps3 form a transfer element 41_3 having a configuration similar to that of the transfer element 41. The transfer element 41_3 is connected in series between the signal input terminal Ti1 and the signal output terminal To2.

The NMOS transistor Mns3 as a third N-type transfer transistor has a gate connected to the node N4 of the clock bootstrap circuit 301. The PMOS transistor Mps3 as a third P-type transfer transistor has a gate connected to the node N1 of the clock bootstrap circuit 30_1.

The NMOS transistor Mns4 and the PMOS transistor Mps4 are connected in series with each other, and form a transfer element 41_4 having a configuration similar to that of the transfer element 41. The transfer element 41_4 is connected in series between the signal input terminal Ti2 and the signal output terminal To2.

The NMOS transistor Mns4 as a fourth N-type transfer transistor has a gate connected to the node N5 of the clock bootstrap circuit 30_2. The PMOS transistor Mps4 as a fourth P-type transfer transistor has a gate connected to the node N2 of the clock bootstrap circuit 30_2.

Thus, the transfer circuit 40I includes four transfer elements 41_1 to 41_4 corresponding to the transfer elements 41, and can be regarded as two (a pair of) transfer circuits 40F connected in parallel to each other.

The analog switch 1I operates in a similar manner as the analog switch 1F. The transfer circuit 40I has a first connection state, under which the NMOS transistors Mns1 and Mns4 and the PMOS transistors Mps1 and Mps4 are turned on, and a second connection state, under which the NMOS transistors Mns2 and Mns3 and the PMOS transistors Mps2 and Mps3 are turned on.

Under the first connection state and the second connection state, the transfer circuit 40I is in the connected state. To describe more specifically, under the first connection state, a conduction state is established between the signal input terminal Ti1 and the signal output terminal To1, and between the signal input terminal Ti2 and the signal output terminal To2. In the second connection state, a conduction state is established between the signal input terminal Ti1 and the signal output terminal To2, and between the signal input terminal Ti2 and the signal output terminal To1. Under a state other than the first connection state and the second connection state described above, the transfer circuit 40I is in the disconnected state.

The analog switch 1I described above operates in a similar manner as the analog switch 1F, and hence the transfer circuit 40I can make a transition between the connected state including the first connection state and the second connection state, and the disconnected state. Thus, the analog switch 1I can switch among an operation of outputting the signals supplied to the signal input terminals Ti1 and Ti2 from the signal output terminals To1 and To2, respectively, an operation of outputting the signals from the signal output terminals To2 and To1, respectively, and an operation of outputting none of the signals. Further, with the analog switch 1I, effects similar to those of the analog switch 1F can be obtained.

Figure 10:
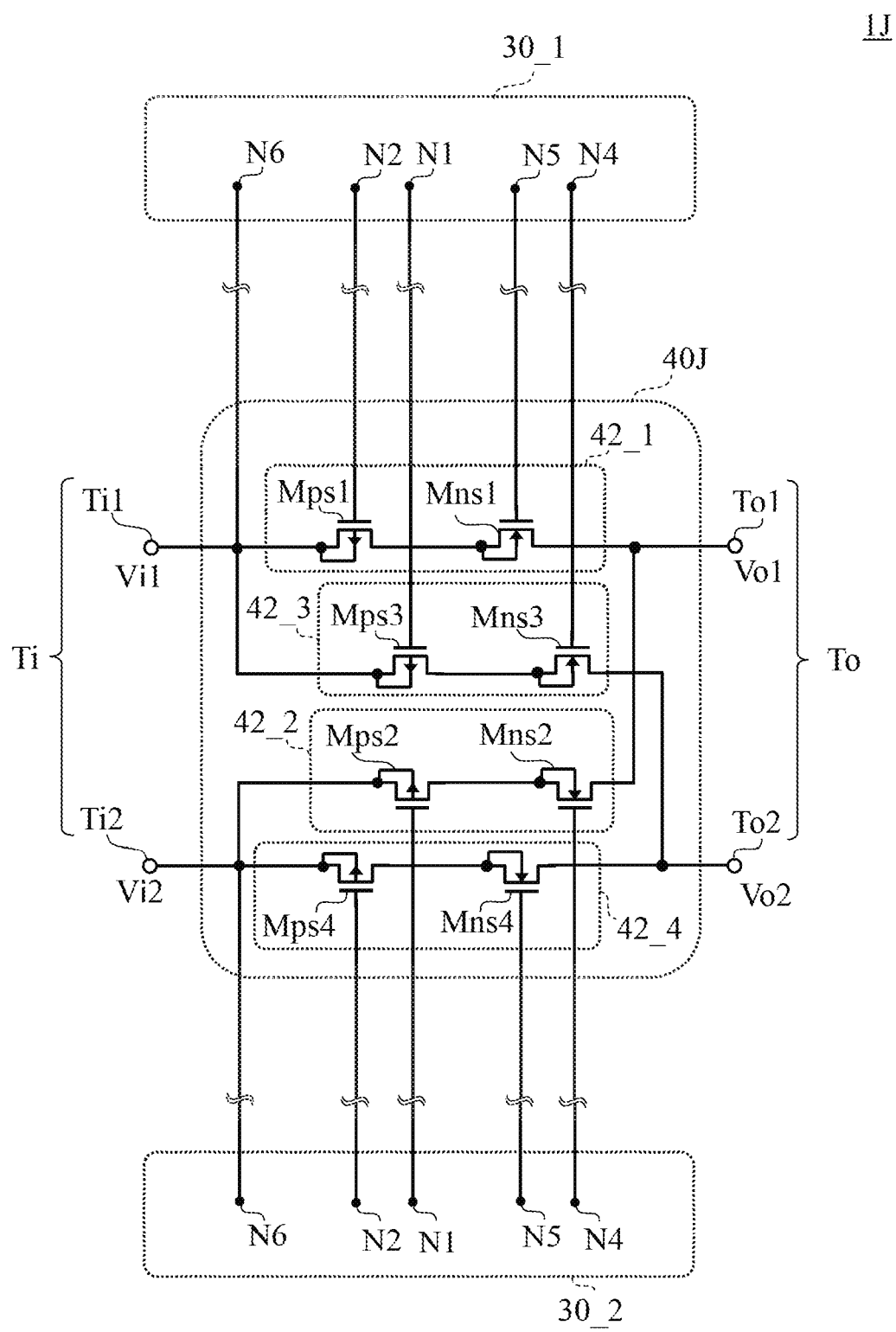
FIG. 10 is a circuit diagram for illustrating a tenth configuration example of the analog switch according to the at least one embodiment.

FIG. 10 is a circuit diagram for illustrating a configuration of an analog switch 1J which is tenth example of the analog switch according to the at least one embodiment. The analog switch 1J in FIG. 10 is illustrated with the components such as the clock generation circuit 50, which are common to the analog switch 1G, being partially omitted.

The analog switch 1J is different from the analog switch 1G in including a transfer circuit 40J instead of the transfer circuit 40G, but is substantially the same as the analog switch 1G otherwise. More specifically, the transfer circuit 40J further includes, with respect to the transfer circuit 40G, the signal output terminal To2, the PMOS transistor Mps3 and the NMOS transistor Mns3 connected in series between the signal input terminal Ti1 and the signal output terminal To2, and the PMOS transistor Mps4 and the NMOS transistor Mns4 connected in series between the signal input terminal Ti2 and the signal output terminal To2.

The PMOS transistor Mps3 and the NMOS transistor Mns3 are connected in series with each other, and form a transfer element 42_3 having a configuration similar to that of the transfer element 42. Further, the PMOS transistor Mps4 and the NMOS transistor Mns4 are connected in series with each other. These transistors Mps4 and Mns4 form a transfer element 42_4 having a configuration similar to that of the transfer element 42. Thus, the transfer circuit 40J can be regarded as two (a pair of) transfer circuits 40G connected in parallel to each other.

In other words, the analog switch 1J includes, with respect to the analog switch 1I, the transfer elements 42_1 to 42_4 instead of the transfer elements 41_1 to 41_4.

The analog switch 1J operates in a similar manner as the analog switch 1G. As with the transfer circuit 40I, the transfer circuit 40J is configured to make a transition between the connected state and the disconnected state. In other words, the connected state of the transfer circuit 40J includes a first connection state, under which the PMOS transistors Mps1 and Mps4 and the NMOS transistors Mns1 and Mns4 are turned on, and a second connection state, under which the NMOS transistors Mns2 and Mns3 and the PMOS transistors Mps2 and Mps3 are turned on. The disconnected state of the transfer circuit 40J is a state other than the first connection state and the second connection state.

With the analog switch 1J described above operating in a similar manner as the analog switch 1G, the transfer circuit 40J can make a transition between the connected state including the first connection state and the second connection state and the disconnected state. Thus, the analog switch 1J can switch among an operation of outputting the signals supplied to the signal input terminals Ti1 and Ti2 from the signal output terminals To1 and To2, respectively, an operation of outputting the signals from the signal output terminals To2 and To1, respectively, and an operation of outputting none of the signals. Further, with the analog switch 1J, effects similar to those of the analog switch 1G can be obtained.

Figure 11:
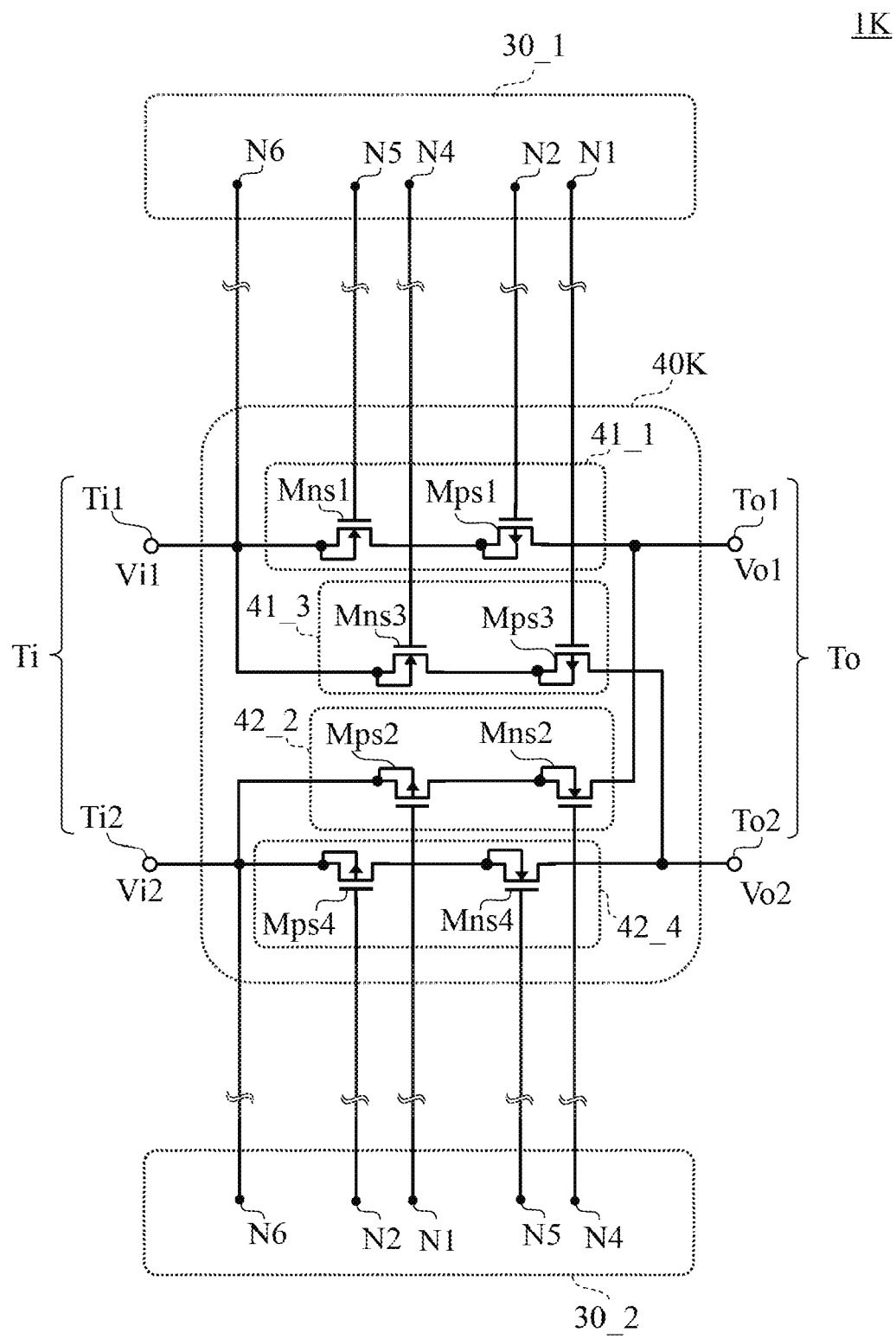
FIG. 11 is a circuit diagram for illustrating an eleventh configuration example of the analog switch according to the at least one embodiment.

FIG. 11 is a circuit diagram for illustrating a configuration of an analog switch 1K which is eleventh example of the analog switch according to the at least one embodiment. The analog switch 1K in FIG. 11 is illustrated with the components such as the clock generation circuit 50, which are common to the analog switch 1H, being partially omitted.

The analog switch 1K is different from the analog switch 1H in including a transfer circuit 40K instead of the transfer circuit 40H, but is substantially the same as the analog switch 1H otherwise. More specifically, the transfer circuit 40K further includes, with respect to the transfer circuit 40H, the signal output terminal To2, the NMOS transistor Mns3 and the PMOS transistor Mps3 connected in series between the signal input terminal Ti1 and the signal output terminal To2, and the NMOS transistor Mns4 and the PMOS transistor Mps4 connected in series between the signal input terminal Ti2 and the signal output terminal To2.

The NMOS transistor Mns3 and the PMOS transistor Mps3 are connected in series with each other, and form a transfer element 41_3 having a configuration similar to that of the transfer element 41. Further, the PMOS transistor Mps4 and the NMOS transistor Mns4 are connected in series with each other, and form a transfer element 42_4 having a configuration similar to that of the transfer element 42. Thus, the transfer circuit 40K can be regarded as two (a pair of) transfer circuits 40H connected in parallel to each other.

In other words, the analog switch 1K includes, with respect to the analog switch 1I, the transfer elements 42_2 to 42_4 instead of the transfer elements 41_2 to 41_4. In other words, the analog switch 1K includes, with respect to the analog switch 1J, the transfer elements 41_1 and 413 instead of the transfer elements 421 and 423.

The analog switch 1K operates in a similar manner as the analog switch 1H. As with the transfer circuit 40H, the transfer circuit 40K is configured to make a transition between the connected state and the disconnected state. In other words, the connected state of the transfer circuit 40K includes a first connection state, under which the NMOS transistors Mns1 and Mns4 and the PMOS transistors Mps1 and Mps4 are turned on, and a second connection state, under which the NMOS transistors Mns2 and Mns3 and the PMOS transistors Mps2 and Mps3 are turned on. The disconnected state of the transfer circuit 40K is a state other than the first connection state and the second connection state.

With the analog switch 1K described above operating in a similar manner as the analog switch 1H, the transfer circuit 40K can make a transition between the connected state including the first connection state and the second connection state and the disconnected state. Thus, the analog switch 1K can switch among an operation of outputting the signals supplied to the signal input terminals Ti1 and Ti2 from the signal output terminals To1 and To2, respectively, an operation of outputting the signals from the signal output terminals To2 and To1, respectively, and an operation of outputting none of the signals. Further, with the analog switch 1K, effects similar to those of the analog switch 1H can be obtained.

Figure 12:
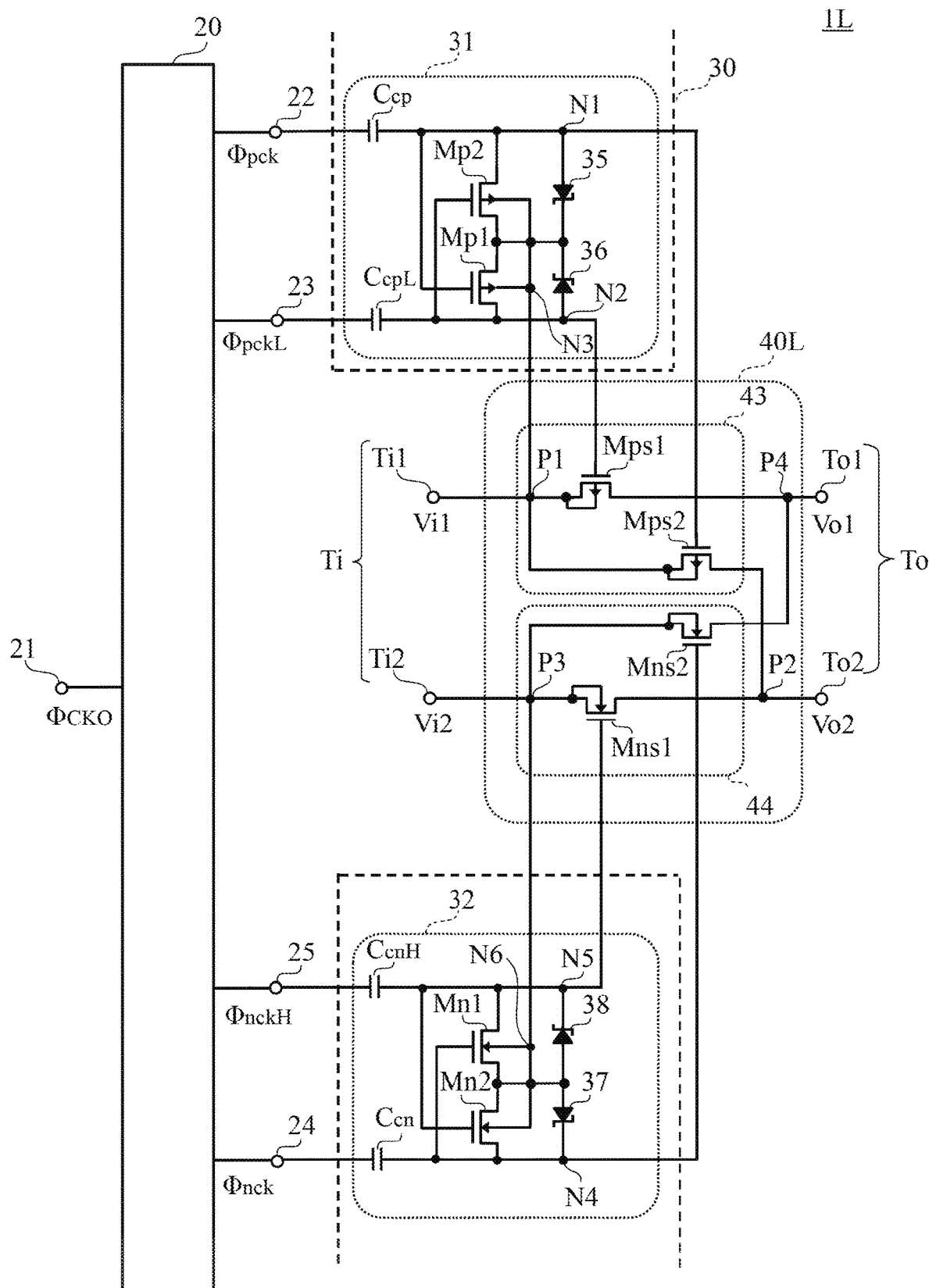
FIG. 12 is a circuit diagram for illustrating a twelfth configuration example of the analog switch according to the at least one embodiment.

FIG. 12 is a circuit diagram for illustrating a configuration of an analog switch 1L which is twelfth example of the analog switch according to the at least one embodiment.

The analog switch 1L includes, as with the analog switches 1I to 1K, the signal input unit Ti containing the signal input terminals Ti1 and Ti2, and the signal output unit To containing the signal output terminals To1 and To2. Meanwhile, the analog switch 1L is simplified in configuration with respect to the analog switches 1I to 1K on the condition that the following relationship is established one voltage of the signal input terminals Ti1 and Ti2 is equal to or higher than the other voltage of the signal input terminals Ti1 and Ti2. Here, a specific description is given taking an example of a case in which the voltage Vi2 as a second input voltage supplied to the signal input terminal Ti2 is a voltage that is equal to or lower than the voltage Vi1 as a first input voltage supplied to the signal input terminal Ti1, that is, the voltage Vi2 is equal to or lower than the voltage Vi1 (or the voltage Vi1 is equal to or higher than the voltage Vi2).

The case in which the following relationship is established the voltage Vi2 is equal to or lower than the voltage Vi1, that is, Vi1≥Vi2, includes a case in which, for example, a positive terminal and a negative terminal of a DC power source are connected to the signal input terminals Ti1 and Ti2, respectively.

The analog switch 1L includes, with respect to the analog switches 1I to 1K, a clock generation circuit 20 instead of the clock generation circuit 50. Further, the analog switch 1L includes, with respect to the analog switches 1I to 1K, a clock bootstrap circuit 30 instead of the clock bootstrap circuits 30_1 and 30_2, and a transfer circuit 40L instead of the transfer circuits 40I to 40K.

In the clock bootstrap circuit 30 as a control signal generation circuit, the step-down circuit 31 as a first control signal generation circuit includes a node N2 as a first output port, and a node N1 as a third output port. Further, the step-up circuit 32 as a second control signal generation circuit includes a node N5 as a second output port, and a node N4 as a fourth output port.

The transfer circuit 40L includes a transfer element 43 including PMOS transistors Mps1 and Mps2 having sources connected to each other, and a transfer element 44 including the NMOS transistors Mns1 and Mns2 having sources connected to each other.

The transfer element 43 has a configuration obtained by omitting the NMOS transistors Mns1 and Mns3 from the two transfer elements 41_1 and 41_3 in the transfer circuits 40I and 40K. In other words, the transfer element 43 includes a conductor configured to electrically connect the signal input terminal Ti1 and the source of the PMOS transistor Mps1 instead of the NMOS transistor Mns1 in the transfer element 41_1, and a conductor configured to electrically connect the signal input terminal Ti1 and the source of the PMOS transistor Mps3 instead of the NMOS transistor Mns3 in the transfer element 413.

The transfer element 43 has a configuration obtained by omitting the NMOS transistors Mns1 and Mns3 from the two transfer elements 42_1 and 42_3 in the transfer circuit 40J. In other words, the transfer element 43 includes a conductor configured to electrically connect the drain of the PMOS transistor Mps1 and the signal output terminal To1 instead of the NMOS transistor Mns1 in the transfer element 42_1, and a conductor configured to electrically connect the drain of the PMOS transistor Mps3 and the signal output terminal To2 instead of the NMOS transistor Mns3 in the transfer element 42_3.

As described above, the transfer element 43 includes the PMOS transistors Mps1 and Mps3 in the transfer circuits 40I to 40K, as the PMOS transistors Mps1 and Mps2, respectively.

The PMOS transistor Mps1 has a source and a back gate connected to the signal input terminal Ti1, a drain connected to the signal output terminal To1, and a gate connected to the node N2 as one output port of the first output port and the third output port. The PMOS transistor Mps2 has a source and a back gate connected to a connection point P1 between the signal input terminal Ti1, and the source and the back gate of the PMOS transistor Mps1, a drain connected to the signal output terminal To2, and a gate connected to the node N1 as the other output port of the first output port and the third output port.

The transfer element 44 has a configuration obtained by omitting the PMOS transistors Mps2 and Mps4 from the two transfer elements 41_2 and 41_4 in the transfer circuit 40I. In other words, the transfer element 44 includes a conductor configured to electrically connect the drain of the NMOS transistor Mns2 and the signal output terminal To1 instead of the PMOS transistor Mps2 in the transfer element 41_2, and a conductor configured to electrically connect the drain of the NMOS transistor Mns4 and the signal output terminal To2 instead of the PMOS transistor Mps4 in the transfer element 41_4.

The transfer element 44 has a configuration obtained by omitting the PMOS transistors Mps2 and Mps4 from the two transfer elements 42_2 and 42_4 in the transfer circuits 40J and 40K. In other words, the transfer element 44 includes a conductor configured to electrically connect the source of the NMOS transistor Mns2 and the signal input terminal Ti2 instead of the PMOS transistor Mps2 in the transfer element 42_2, and a conductor configured to electrically connect a source of the NMOS transistor Mns4 and the signal input terminal Ti2 instead of the PMOS transistor Mps4 in the transfer element 42_4.

As described above, the transfer element 44 includes the NMOS transistors Mns4 and Mns2 in the transfer circuits 40I to 40K, as the NMOS transistors Mns1 and Mns2, respectively.

The NMOS transistor Mns1 has a source and a back gate connected to the signal input terminal Ti2, a drain connected to a connection point P2 between the signal output terminal To2 and the drain of the PMOS transistor Mps2, and a gate connected to the node N5 as the second output port. The NMOS transistor Mns2 has a source and a back gate connected to a connection point P3 between the signal input terminal Ti2, and the source and the back gate of the NMOS transistor Mns1, a drain connected to a connection point P4 between the signal output terminal To1 and the drain of the PMOS transistor Mps1, and a gate connected to the node N4 as the fourth output port.

As described above, the analog switch 1L has a configuration obtained by omitting, from the analog switches 1I to 1K, the step-down circuit 31_2, the step-up circuit 32_1, the clock output terminal 52_2, the clock output terminal 53_2, the clock output terminal 54_1, the clock output terminal 55_1, the PMOS transistors Mps2 and Mps4 connected to the step-down circuit 31_2, and the NMOS transistors Mns1 and Mns3 connected to the step-up circuit 32_1.

For example, according to the analog switch 1L in which the following relationship is established one voltage of the signal input terminals Ti1 and Ti2 is equal to or higher than the other voltage of the signal input terminals Ti1 and Ti2, e.g., Vi1≥Vi2 is satisfied, the circuit configuration can be simplified with respect to the analog switches 1I to 1K. To describe specifically, the analog switch 1L, which can operate in a similar manner as the analog switches 1I to 1K, can be formed with half the number of generated clocks, step-down circuits 31, step-up circuits 32, NMOS transistors, and PMOS transistors with respect to the analog switches 1I to 1K. Thus, the analog switch 1L can further reduce the circuit scale and the amount of power consumption with respect to the analog switches 1I to 1K.

In the analog switch 1L, when Vi1≥Vi2 is satisfied, a voltage Vo1 as a first output voltage is a voltage that is equal to or lower than the voltage Vi1. Further, when Vi1≥Vi2 is satisfied, a voltage Vo2 as a second output voltage is a voltage that is equal to or higher than the voltage Vi2. In other words, when Vi1≥Vi2 is satisfied, Vi1≥Vo1 is satisfied, and Vi2≤Vo2 is satisfied.

In the analog switch 1L, parasitic diodes included in the following MOS transistors: the NMOS transistors Mns1 and Mns2 and the PMOS transistors Mps1 and Mps2 are connected in reverse directions. Thus, the analog switch 1L can prevent, in a period in which the transfer circuit 40L is controlled to be in an off-state, the signal input terminal Ti1 or the signal input terminal Ti2 and the signal output terminal To1 or the signal output terminal To2 from conducting via the parasitic diodes included in the NMOS transistors Mns1 and Mns2 and the PMOS transistors Mps1 and Mps2.

The transfer circuit 40L described above is an example in which the PMOS transistors Mps1 and Mps2 have the gates connected to the nodes N2 and N1, respectively, but the present invention is not limited thereto. The PMOS transistors Mps1 and Mps2 may have gates connected to the nodes N1 and N2, respectively. In this case where the PMOS transistors Mps1 and Mps2 have the gates connected to the nodes N1 and N2, respectively, the NMOS transistors Mns1 and Mns2 have gates connected to the nodes N4 and N5, respectively.

Next, an application example of the analog switch according to the at least one embodiment is described. The analog switch according to the at least one embodiment can be applied, for example, to a switched capacitor amplifier.

Figure 13A:
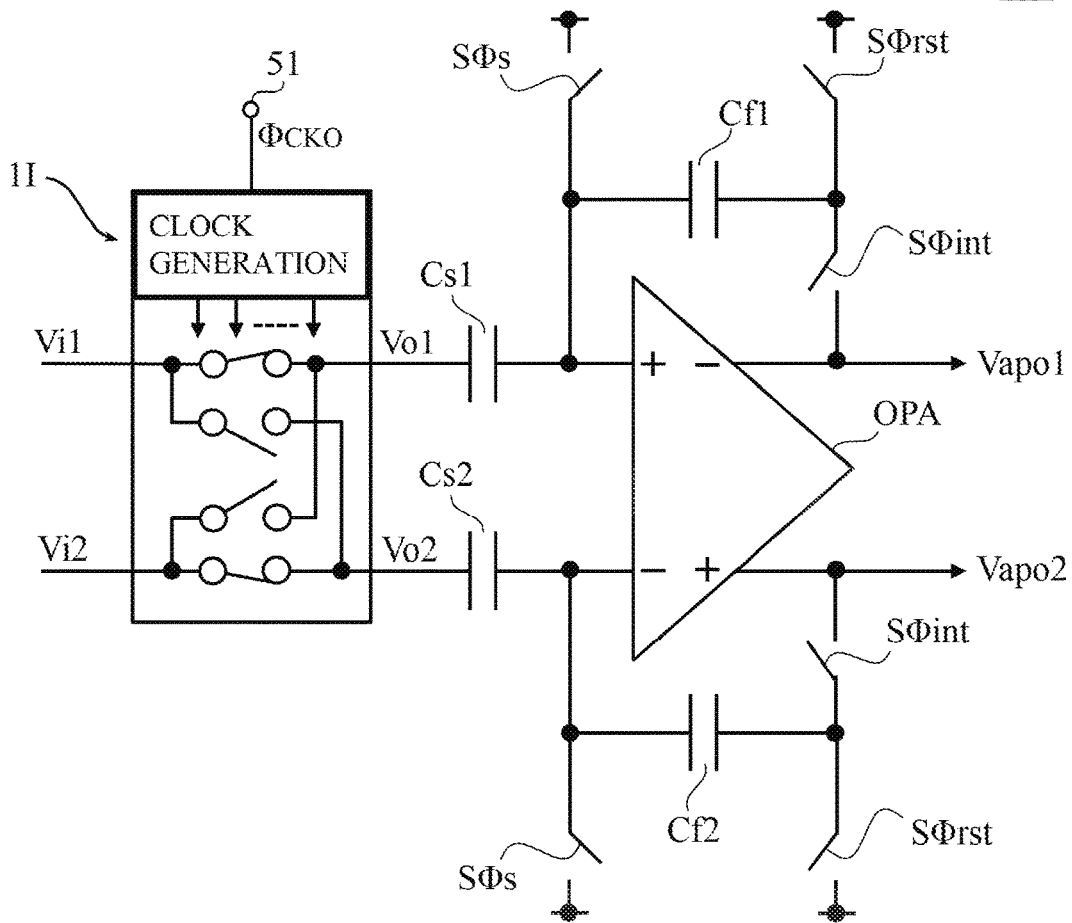
FIG. 13A is an explanatory diagram illustrating an application example of the analog switch according to the embodiment.
Figure 13B:
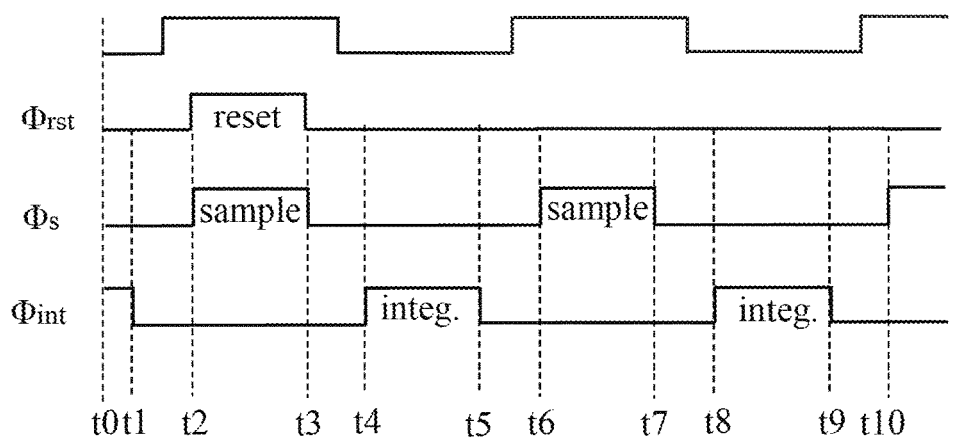
FIG. 13B is a timing chart of clocks in the application example.

FIG. 13A is a schematic diagram for illustrating a switched capacitor amplifier 200 which is the application example of the analog switch according to the at least one embodiment, and FIG. 13B is a timing chart of clocks ΦCKO, Φrst, Φs, and Φint in the switched capacitor amplifier 200.

The switched capacitor amplifier 200 is an amplifier configured to amplify and integrate a difference voltage between the voltages Vi1 and Vi2 of the two input signals, and output a signal obtained by amplifying and integrating the difference voltage. The switched capacitor amplifier 200 includes the analog switch 1I, sampling capacitors Cs1 and Cs2, a differential amplifier OPA, feedback capacitors Cf1 and Cf2, and switches SWs, SΦrst, and SΦint.

The switch SΦs is configured to switch between a state in which a predetermined potential is applied to an input terminal of the differential amplifier OPA, and a state in which the predetermined potential is not applied. The switch SΦint is configured to switch between a connection state in which the feedback capacitors Cf1 and Cf2 are connected between the input terminal and an output terminal of the differential amplifier OPA, and a non-connection state in which the feedback capacitors Cf1 and Cf2 are not connected. The switch SΦrst is configured to switch between a state in which the predetermined potential is applied to, of terminals of the feedback capacitors Cf1 and Cf2, an terminal connected to the output terminal of the differential amplifier OPA to be connected/disconnected through the switch SΦint, and a state in which the predetermined potential is not applied.

The clocks Φrst, Φs, and Φint are clocks in synchronization with the clock ΦCKO, and are used to switch the switches SΦrst, SΦs, and SΦint between the connected state and the disconnected state. The clocks Φrst, Φs, and Φint are supplied to a controller (not shown) configured to switch the switches SΦrst, SΦs, and SΦint between the connected state and the disconnected state. The controller is configured to switch the switches SΦrst, SΦs, and SΦint between the connected state and the disconnected state based on the supplied clocks Φrst, Φs, and Φint. The switches SΦrst, SΦs, and SΦint are in the connected state in a period in which the clocks Φrst, Φs, and Φint are at the H level, respectively, and are in the disconnected state in a period in which the clocks Φrst, Φs, and Φint are at the L level, respectively.

Through application of an analog switch including the signal input unit Ti containing the two signal input terminals Ti1 and Ti2, such as the analog switch 1I, when the difference between the voltages Vi1 and Vi2 of analog signals supplied to the signal input terminals Ti1 and Ti2, respectively, is lower than a withstand voltage of a MOS transistor on the signal output unit To side in the transfer circuit 40I, the switched capacitor amplifier 200 can input analog signals having the voltages Vi1 and Vi2 that are higher than the withstand voltage of the MOS transistor on the signal output unit To side to the differential amplifier OPA while switching the analog signals.

Further, to the sampling capacitors Cs1 and Cs2, elements capable of withstanding the voltages Vi1 and Vi2, that is, elements having withstand voltages that are higher than the voltages Vi1 and Vi2 are applied, but for the other elements, it is not always required that elements having withstand voltages that are higher than the voltages Vi1 and Vi2 be applied. For the elements other than the sampling capacitors Cs1 and Cs2, when a difference between the voltages Vi1 and Vi2 is small, that is, when analog signals having substantially equal voltages are supplied, elements having relatively low withstand voltages to correspond to the difference between the voltages Vi1 and Vi2 can be applied. Thus, as compared to conventional analog switch configured to switch an analog signal having a voltage that is substantially equal to the voltages Vi1 and Vi2, the circuit scale can be reduced, and the amount of power consumption can be reduced.

As described above, the analog switches 1A to 1L are configured so that the difference between the voltages applied to the gate and the source of the MOS transistor having the source connected to the signal input unit Ti is small as compared to a withstand voltage of the transistor. The difference between the voltages applied to the gate and the source of the MOS transistor having the source connected to the signal input unit Ti is relatively lower than the voltages applied to the gate and the source of the MOS transistor having the source connected to the signal input unit Ti. Thus, the MOS transistors each having a withstand voltage that is relatively lower than the voltages applied to the gate and the source of the MOS transistor having the source connected to the signal input unit Ti can be applied to form the clock bootstrap circuit 30 and the transfer circuits 40A to 40L.

Conversely, as long as the difference between the voltages applied to the gate and the source of the MOS transistor having the source connected to the signal input unit Ti is small, and does not exceed withstand voltages of the MOS transistors forming the transfer circuits 40A to 40L, the analog switches 1A to 1L can connect/disconnect an analog signal having a high voltage exceeding the withstand voltages between the signal input unit Ti and the signal output unit To even when the withstand voltages of the MOS transistors forming the transfer circuits 40A to 40L are low.

Further, in the analog switches 1A to 1L, as described above, the withstand voltages of the MOS transistors forming the clock bootstrap circuit 30 and the transfer circuits 40A to 40L are relatively low with respect to the voltage of the analog signal that is connected/disconnected between the signal input unit Ti and the signal output unit To. Thus, with respect to conventional analog switch formed of the transistors having the withstand voltages that are equal to or higher than the voltage of the analog signal to be connected/disconnected, the circuit can be downsized, and the amount of power consumption can be reduced.

It is not required that the analog switches 1A to 1L include, as in the analog switch 150 (FIG. 15), a configuration for applying the predetermined voltage such as the ground voltage VSS (<<VDD), to a terminal of the MOS transfer circuit 130. The analog switches 1A to 1L does not include the configuration for applying the predetermined voltage to the signal input unit Ti or the signal output unit To, and accordingly enables the switching operation to be increased in speed compared to that in the analog switch 150. Further, the analog switch 150 have the configuration in which the ground line 152 and the terminal Vio2 can conduct through the transistor M7, and hence a steady-state current disadvantageously flows, though for a short period of time, through a path between the signal input unit Ti and the signal output unit To. This steady-state current is superimposed as a disturbance on the analog signal to be switched.

In contrast, the analog switches 1A to 1L does not include components, which conduct with the signal input unit Ti or the signal output unit To, other than the transfer circuits 40A to 40L, and accordingly enables the disturbance to be prevented from being superimposed on the analog signal to be switched. In other words, the analog switches 1A to 1L can output the analog signal to be switched from the signal output unit To with high accuracy.

The present invention is not limited to the above-described embodiments, and can be carried out in various forms in addition to the examples described above in the stage of carrying out the invention, and various omissions, replacements, and alterations may be made thereto without departing from the gist of the invention. These embodiments and modifications thereof are encompassed in the scope and the gist of the invention, and are encompassed in the inventions defined in claims and equivalents thereof.

What is claimed is:

1. An analog switch configured to connect or disconnect an electrical path between one terminal selected from at least one signal input terminal containing a first signal input terminal and one terminal selected from at least one signal output terminal containing a first signal output terminal, the analog switch comprising:
    a clock generation circuit configured to generate a plurality of clocks based on a reference clock supplied thereto, the plurality of clocks including a first clock and a second clock which is opposite in polarity to the first clock;
    a transfer circuit including:
        a first N-type transfer transistor which is an N-type field effect transistor having a source and a back gate connected to each other; and
        a first P-type transfer transistor which is a P-type field effect transistor having a source and a back gate connected to each other,
        of the first N-type transfer transistor and the first P-type transfer transistor, one transfer transistor having a drain connected to a source of another transfer transistor, the one transfer transistor having the source connected to the first signal input terminal, the another transfer transistor having a drain connected to the first signal output terminal;
    a first control signal generation circuit configured to generate a first control signal for controlling an on-state and an off-state of the first P-type transfer transistor based on a voltage at the first signal input terminal and the first clock; and
    a second control signal generation circuit configured to generate a second control signal for controlling an on-state and an off-state of the first N-type transfer transistor based on the voltage at the first signal input terminal and the second clock.

2. The analog switch according to claim 1,
wherein the clock generation circuit includes:
    a clock input terminal to which the reference clock is supplied;
    a first clock output terminal from which the first clock is output;
    a second clock output terminal from which the second clock is output;
    a third clock output terminal configured to generate a third clock based on the reference clock, and to output the generated third clock; and
    a fourth clock output terminal configured to generate a fourth clock based on the reference clock, and to output the generated fourth clock,
    wherein the third clock is at a high-level period in which the first clock is at a low level, and
    wherein the fourth clock is opposite in polarity to the third clock, and is at a low-level period in which the second clock is at a high level,
wherein the first control signal generation circuit includes:
    a first P-type FET having a source and a back gate connected to each other;
    a second P-type FET having a source connected to the source and the back gate of the first P-type FET, and to a back gate of the second P-type FET;
    a first capacitor having first end connected to the first clock output terminal, and second end connected to a drain of the second P-type FET and a gate of the first P-type FET;
    a second capacitor having first end connected to the third clock output terminal, and second end connected to a drain of the first P-type FET and a gate of the second P-type FET;
    a first Zener diode having an anode connected to the drain of the second P-type FET, and a cathode connected to the source and the back gate of the second P-type FET; and
    a second Zener diode having an anode connected to the drain of the first P-type FET, and a cathode connected to the source and the back gate of the first P-type FET,
wherein the second control signal generation circuit includes:
    a first N-type FET having a source and a back gate connected to each other;
    a second N-type FET having a source which is connected to the source and the back gate of the first N-type FET, and to a back gate of the second N-type FET;
    a third capacitor having first end connected to the second clock output terminal and second end connected to a drain of the second N-type FET and a gate of the first N-type FET;
    a fourth capacitor having first end connected to the fourth clock output terminal and second end connected to a drain of the first N-type FET and a gate of the second N-type FET;
    a third Zener diode having an anode connected to the source and the back gate of the second N-type FET and a cathode connected to the drain of the second N-type FET; and
    a fourth Zener diode having an anode connected to the source and the back gate of the first N-type FET and a cathode connected to the drain of the first N-type FET,
wherein a connection point between the first signal input terminal and the source of the one transfer transistor is connected to a first node and a second node,
wherein the first node is a connection point among the source and the back gate of the first P-type FET, the source and the back gate of the second P-type FET, the cathode of the first Zener diode, and the cathode of the second Zener diode, and
wherein the second node is a connection point among the source and the back gate of the first N-type FET, the source and the back gate of the second N-type FET, the anode of the third Zener diode, and the anode of the fourth Zener diode.

3. The analog switch according to claim 2,
wherein the first control signal generation circuit has a third node and a fourth node,
wherein the second control signal generation circuit has a fifth node and a sixth node,
wherein the third node is a connection point among the drain of the first P-type FET, the gate of the second P-type FET, the second end of the second capacitor, and the anode of the second Zener diode of the first control signal generation circuit,
wherein the fourth node is a connection point among the drain of the second P-type FET, the gate of the first P-type FET, the second end of the first capacitor, and the anode of the first Zener diode of the first control signal generation circuit,
wherein the fifth node is a connection point among the drain of the first N-type FET, the gate of the second N-type FET, the second end of the fourth capacitor, and the cathode of the fourth Zener diode of the second control signal generation circuit,
wherein the sixth node is a connection point among the drain of the second N-type FET, the gate of the first N-type FET, the second end of the third capacitor, and the cathode of the third Zener diode of the second control signal generation circuit,
wherein the first P-type transfer transistor has a gate connected to the third node, and
wherein the first N-type transfer transistor has a gate connected to the fifth node.

4. The analog switch according to claim 3,
wherein the at least one signal output terminal further contains a second signal output terminal,
wherein the transfer circuit further includes:
 a second N-type transfer transistor having a source and a back gate connected to each other; and
 a second P-type transfer transistor having a source and a back gate connected to each other,
wherein, of the second N-type transfer transistor and the second P-type transfer transistor, one transfer transistor has a drain which is connected to the source of another transfer transistor, the source of the one transfer transistor is connected to the source of the one transfer transistor of the first N-type transfer transistor and the first P-type transfer transistor, and to the first signal input terminal, and another transfer transistor has a drain connected to the second signal output terminal,
wherein the second P-type transfer transistor has a gate connected to the fourth node, and
wherein the second N-type transfer transistor has a gate connected to the sixth node.

5. The analog switch according to claim 3, further comprising:
a third control signal generation circuit configured to generate a third control signal which is at a high-level period in which the first control signal is at a low level; and
a fourth control signal generation circuit configured to generate a fourth control signal which is opposite in polarity to the third control signal, and is at a low-level period in which the second control signal is at a high level,
wherein the third control signal generation circuit is the same in configuration as the first control signal generation circuit, and has a seventh node and an eighth node,
wherein the fourth control signal generation circuit is the same in configuration as the second control signal generation circuit, and has a ninth node and a tenth node,
wherein the seventh node is a connection point among the drain of the second P-type FET, the gate of the first P-type FET, the second end of the second capacitor, and the anode of the second Zener diode of the third control signal generation circuit,
wherein the eighth node is a connection point among the drain of the first P-type FET, the gate of the second P-type FET, the second end of the first capacitor, and the anode of the first Zener diode of the third control signal generation circuit,
wherein the ninth node is a connection point among the drain of the second N-type FET, the gate of the first N-type FET, the second end of the fourth capacitor, and the cathode of the fourth Zener diode of the fourth control signal generation circuit,
wherein the tenth node is a connection point among the drain of the first N-type FET, the gate of the second N-type FET, the second end of the third capacitor, and the cathode of the third Zener diode of the fourth control signal generation circuit,
wherein the at least one signal input terminal further contains a second signal input terminal,
wherein the transfer circuit further includes:
 a second N-type transfer transistor having a source and a back gate connected to each other; and
 a second P-type transfer transistor having a source and a back gate connected to each other,
wherein, of the second N-type transfer transistor and the second P-type transfer transistor, one transfer transistor has a drain connected to the source of another transfer transistor, the one transfer transistor has the source connected to the second signal input terminal, and the another transfer transistor has a drain which is connected to the drain of the one transfer transistor of the first N-type transfer transistor and the first P-type transfer transistor, and to the first signal output terminal,
wherein the second P-type transfer transistor has a gate connected to the eighth node, and
wherein the second N-type transfer transistor has a gate connected to the tenth node.

6. The analog switch according to claim 5,
wherein the at least one signal output terminal further contains a second signal output terminal,
wherein the transfer circuit further includes:
 a third N-type transfer transistor having a source and a back gate connected to each other;
 a fourth N-type transfer transistor having a source and a back gate connected to each other;
 a third P-type transfer transistor having a source and a back gate connected to each other; and
 a fourth P-type transfer transistor having a source and a back gate connected to each other,
wherein, of the third N-type transfer transistor and the third P-type transfer transistor, one transfer transistor has a drain connected to the source of another transfer transistor, the one transfer transistor has the source which is connected to the source of the one transfer transistor of the first N-type transfer transistor and the first P-type transfer transistor, and to the first signal input terminal, and the another transfer transistor has a drain connected to the second signal output terminal, wherein, of the fourth N-type transfer transistor and the fourth P-type transfer transistor, one transfer transistor has a drain connected to the source of another transfer transistor, the one transfer transistor has the source connected to the source of the one transfer transistor of the second N-type transfer transistor and the second P-type transfer transistor, and to the second signal input terminal, and another transfer transistor has a drain which is connected to the drain of the another transfer transistor of the third N-type transfer transistor and the third P-type transfer transistor, and to the second signal output terminal, wherein the third P-type transfer transistor has a gate connected to the fourth node, wherein the third N-type transfer transistor has a gate connected to the sixth node, wherein the fourth P-type transfer transistor has a gate connected to the seventh node, and wherein the fourth N-type transfer transistor has a gate connected to the ninth node.

7. The analog switch according to claim 2, wherein the first control signal generation circuit has a third node and a fourth node, wherein the second control signal generation circuit has a fifth node and a sixth node, wherein the third node is a connection point among the drain of the first P-type FET, the gate of the second P-type FET, the second end of the second capacitor, and the anode of the second Zener diode of the first control signal generation circuit, wherein the fourth node is a connection point among the drain of the second P-type FET, the gate of the first P-type FET, the second end of the first capacitor, and the anode of the first Zener diode of the first control signal generation circuit, wherein the fifth node is a connection point among the drain of the first N-type FET, the gate of the second N-type FET, the second end of the fourth capacitor, and the cathode of the fourth Zener diode of the second control signal generation circuit, wherein the sixth node is a connection point among the drain of the second N-type FET, the gate of the first N-type FET, the second end of the third capacitor, and the cathode of the third Zener diode of the second control signal generation circuit, wherein the first P-type transfer transistor has a gate connected to the fourth node, and wherein the first N-type transfer transistor has a gate connected to the sixth node.

8. The analog switch according to claim 7, wherein the at least one signal output terminal further contains a second signal output terminal, wherein the transfer circuit further includes:
 a second N-type transfer transistor having a source and a back gate connected to each other; and
 a second P-type transfer transistor having a source and a back gate connected to each other, wherein, of the second N-type transfer transistor and the second P-type transfer transistor, one transfer transistor has a drain which is connected to the source of another transfer transistor, the source of the one transfer transistor is connected to the source of the one transfer transistor of the first N-type transfer transistor and the first P-type transfer transistor, and to the first signal input terminal, and another transfer transistor has a drain connected to the second signal output terminal, wherein the second P-type transfer transistor has a gate connected to the third node, and wherein the second N-type transfer transistor has a gate connected to the fifth node.

9. The analog switch according to claim 7, further comprising:

a third control signal generation circuit configured to generate a third control signal which is at a high-level period in which the first control signal is at a low level; and a fourth control signal generation circuit configured to generate a fourth control signal which is opposite in polarity to the third control signal, and is at a low-level period in which the second control signal is at a high level, wherein the third control signal generation circuit is the same in configuration as the first control signal generation circuit, and has a seventh node and an eighth node, wherein the fourth control signal generation circuit is the same in configuration as the second control signal generation circuit, and has a ninth node and a tenth node, wherein the seventh node is a connection point among the drain of the second P-type FET, the gate of the first P-type FET, the second end of the second capacitor, and the anode of the second Zener diode of the third control signal generation circuit, wherein the eighth node is a connection point among the drain of the first P-type FET, the gate of the second P-type FET, the second end of the first capacitor, and the anode of the first Zener diode of the third control signal generation circuit, wherein the ninth node is a connection point among the drain of the second N-type FET, the gate of the first N-type FET, the second end of the fourth capacitor, and the cathode of the fourth Zener diode of the fourth control signal generation circuit, wherein the tenth node is a connection point among the drain of the first N-type FET, the gate of the second N-type FET, the second end of the third capacitor, and the cathode of the third Zener diode of the fourth control signal generation circuit, wherein the at least one signal input terminal further contains a second signal input terminal, wherein the transfer circuit further includes:
 a second N-type transfer transistor having a source and a back gate connected to each other; and
 a second P-type transfer transistor having a source and a back gate connected to each other, wherein, of the second N-type transfer transistor and the second P-type transfer transistor, one transfer transistor has a drain connected to the source of another transfer transistor, the one transfer transistor has the source connected to the second signal input terminal, and the another transfer transistor has a drain which is connected to the drain of the one transfer transistor of the first N-type transfer transistor and the first P-type transfer transistor, and to the first signal output terminal, wherein the second P-type transfer transistor has a gate connected to the seventh node, and wherein the second N-type transfer transistor has a gate connected to the ninth node.

10. The analog switch according to claim 9,
wherein the at least one signal output terminal further contains a second signal output terminal,
wherein the transfer circuit further includes:
  a third N-type transfer transistor having a source and a back gate connected to each other;
  a fourth N-type transfer transistor having a source and a back gate connected to each other;
  a third P-type transfer transistor having a source and a back gate connected to each other; and
  a fourth P-type transfer transistor having a source and a back gate connected to each other,
wherein, of the third N-type transfer transistor and the third P-type transfer transistor, one transfer transistor has a drain connected to the source of another transfer transistor, the one transfer transistor has the source which is connected to the source of the one transfer transistor of the first N-type transfer transistor and the first P-type transfer transistor, and to the first signal input terminal, and the another transfer transistor has a drain connected to the second signal output terminal,
wherein, of the fourth N-type transfer transistor and the fourth P-type transfer transistor, one transfer transistor has a drain connected to the source of another transfer transistor, the one transfer transistor has the source connected to the source of the one transfer transistor of the second N-type transfer transistor and the second P-type transfer transistor, and to the second signal input terminal, and another transfer transistor has a drain which is connected to the drain of the another transfer transistor of the third N-type transfer transistor and the third P-type transfer transistor, and to the second signal output terminal,
wherein the third P-type transfer transistor has a gate connected to the third node,
wherein the third N-type transfer transistor has a gate connected to the fifth node,
wherein the fourth P-type transfer transistor has a gate connected to the eighth node, and
wherein the fourth N-type transfer transistor has a gate connected to the tenth node.

11. The analog switch according to claim 1, wherein the first control signal generation circuit is configured to generate the first control signal having a first level which is the same voltage as the voltage at the first signal input terminal, and a second level which is a lower voltage than the voltage of the first level.

12. The analog switch according to claim 11, wherein the second control signal generation circuit is configured to generate the second control signal having the first level, and a third level which is a higher voltage than the voltage of the first level.

13. The analog switch according to claim 1, wherein the second control signal generation circuit is configured to generate the second control signal having a first level which is the same voltage as a voltage at the first signal input terminal, and a second level which is a higher voltage than the voltage at the first level.

14. An analog switch configured to connect or disconnect an electrical path between one terminal selected from signal input terminals containing a first signal input terminal and a second signal input terminal and one terminal selected from signal output terminals containing a first signal output terminal and a second signal output terminal, the analog switch comprising:
  a clock generation circuit configured to generate a plurality of clocks based on a reference clock supplied thereto, the plurality of clocks including a first clock, a second clock which is opposite in polarity to the first clock, a third clock which is at a high level when the first clock is at a low level, and a fourth clock which is at a low level when the second clock is at a high level, and is opposite in polarity to the third clock;
  a transfer circuit including:
    a first N-type transfer transistor and a second N-type transfer transistor which are two N-type field effect transistors each having a source and a back gate connected to each other; and
    a first P-type transfer transistor and a second P-type transfer transistor which are two P-type field effect transistors each having a source and a back gate connected to each other; and
  a control signal generation circuit configured to generate a first control signal for controlling an on-state and an off-state of the first P-type transfer transistor based on a first voltage which is a voltage at the first signal input terminal and the first clock, generate a second control signal for controlling an on-state and an off-state of the first N-type transfer transistor based on the second voltage which is the same voltage as or lower voltage than the first voltage and the second clock, generate a third control signal for controlling an on-state and an off-state of the second P-type transfer transistor based on the first input voltage and the third clock, and generate a fourth control signal for controlling an on-state and an off-state of the second N-type transfer transistor based on the second input voltage and the fourth clock, the control signal generation circuit including:
    a first output port configured to output the first control signal;
    a second output port configured to output the second control signal;
    a third output port configured to output the third control signal; and
    a fourth output port configured to output the fourth control signal,
  wherein the first P-type transfer transistor has the source and the back gate connected to the first signal input terminal, a drain connected to the first signal output terminal, and a gate connected to the first output port,
  wherein the second P-type transfer transistor has the source and the back gate connected to a connection point between the first signal input terminal, and the source and the back gate of the first P-type transfer transistor, a drain connected to the second signal output terminal, and a gate connected to the third output port,
  wherein the first N-type transfer transistor has the source and the back gate connected to the second signal input terminal, a drain connected to a connection point between the second signal output terminal and the drain of the second P-type transfer transistor, and a gate connected to the second output port, and
  wherein the second N-type transfer transistor has the source and the back gate connected to a connection point between the second signal input terminal, and the source and the back gate of the first N-type transfer transistor, a drain connected to a connection point between the first signal output terminal and the drain of the first P-type transfer transistor, and a gate connected to the fourth output port.

* * * * *